(12) United States Patent
Guler et al.

(10) Patent No.: US 11,742,410 B2
(45) Date of Patent: Aug. 29, 2023

(54) GATE-ALL-AROUND INTEGRATED CIRCUIT STRUCTURES HAVING OXIDE SUB-FINS

(71) Applicant: Intel Corporation, Santa Clara, CA (US)

(72) Inventors: Leonard P. Guler, Hillsboro, OR (US);
Biswajeet Guha, Hillsboro, OR (US);
Tahir Ghani, Portland, OR (US);
Swaminathan Sivakumar, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 1075 days.

(21) Appl. No.: 16/238,783

(22) Filed: Jan. 3, 2019

(65) Prior Publication Data
US 2020/0219978 A1    Jul. 9, 2020

(51) Int. Cl.
| | | |
|---|---|---|
| *H01L 29/00* | (2006.01) | |
| *H01L 29/66* | (2006.01) | |
| *H01L 29/06* | (2006.01) | |
| *H01L 29/423* | (2006.01) | |
| *H01L 29/786* | (2006.01) | |
| *H01L 21/02* | (2006.01) | |
| *H01L 21/306* | (2006.01) | |

(52) U.S. Cl.
CPC .. *H01L 29/66545* (2013.01); *H01L 21/02236* (2013.01); *H01L 21/02532* (2013.01); *H01L 21/02603* (2013.01); *H01L 21/30604* (2013.01); *H01L 29/0673* (2013.01); *H01L 29/42392* (2013.01); *H01L 29/66742* (2013.01); *H01L 29/78696* (2013.01)

(58) Field of Classification Search
CPC .......... H01L 29/0673; H01L 29/42392; H01L 29/78696
See application file for complete search history.

(56) References Cited

U.S. PATENT DOCUMENTS

| | | | | |
|---|---|---|---|---|
| 9,837,414 | B1 * | 12/2017 | Balakrishnan | .... H01L 21/76895 |
| 2017/0141112 | A1 * | 5/2017 | Ching | ............. H01L 21/823807 |
| 2017/0162693 | A1 * | 6/2017 | Bhimarasetti | ..... H01L 29/42376 |
| 2018/0190545 | A1 * | 7/2018 | Bi | ...................... H01L 29/78696 |
| 2020/0219979 | A1 * | 7/2020 | Rachmady | .......... H01L 21/8221 |

OTHER PUBLICATIONS

"Over". Merriam-Webster.com. 2023. https://www.merriam-webster.com/dictionary/over (Jan. 3, 2023). (Year: 2023).*
"Vertical." Merriam-Webster.com. 2023. https://www.merriam-webster.com/dictionary/vertically (Jan. 3, 2023). (Year: 2023).*

* cited by examiner

*Primary Examiner* — Reema Patel
(74) *Attorney, Agent, or Firm* — Schwabe, Williamson & Wyatt, P.C.

(57) ABSTRACT

Gate-all-around integrated circuit structures having oxide sub-fins, and methods of fabricating gate-all-around integrated circuit structures having oxide sub-fins, are described. For example, an integrated circuit structure includes an oxide sub-fin structure having a top and sidewalls. An oxidation catalyst layer is on the top and sidewalls of the oxide sub-fin structure. A vertical arrangement of nanowires is above the oxide sub-fin structure. A gate stack is surrounding the vertical arrangement of nanowires and on at least the portion of the oxidation catalyst layer on the top of the oxide sub-fin structure.

10 Claims, 15 Drawing Sheets

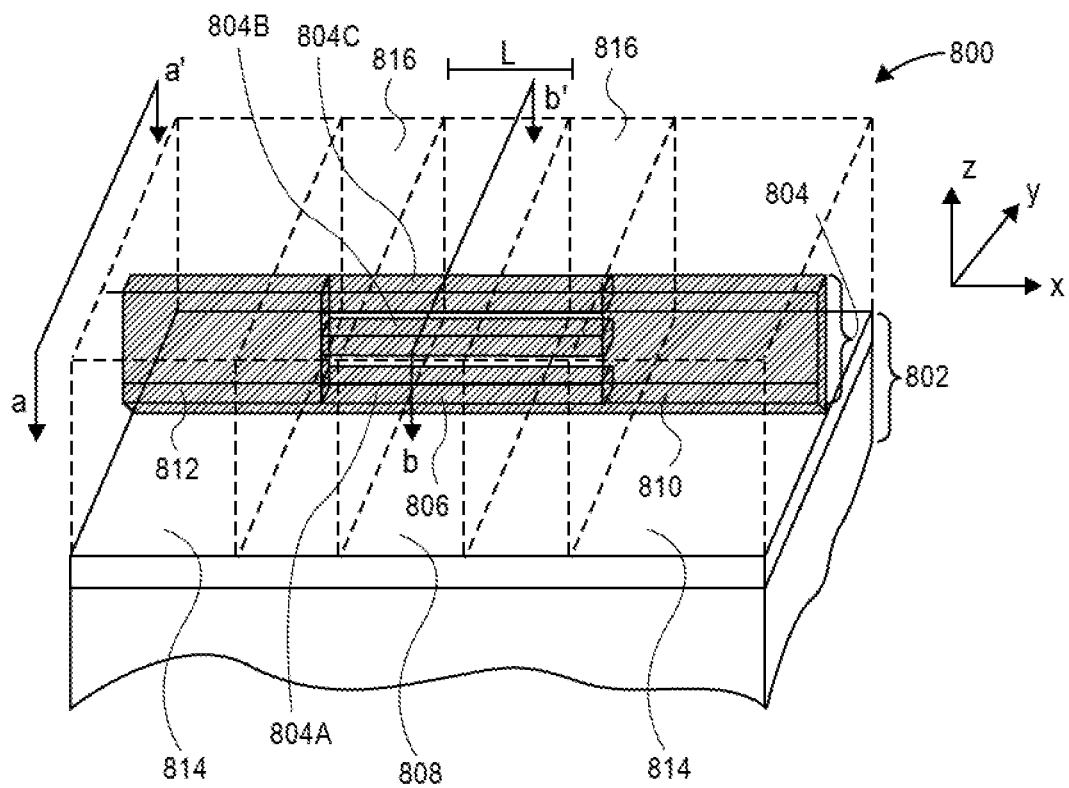
FIG. 8A
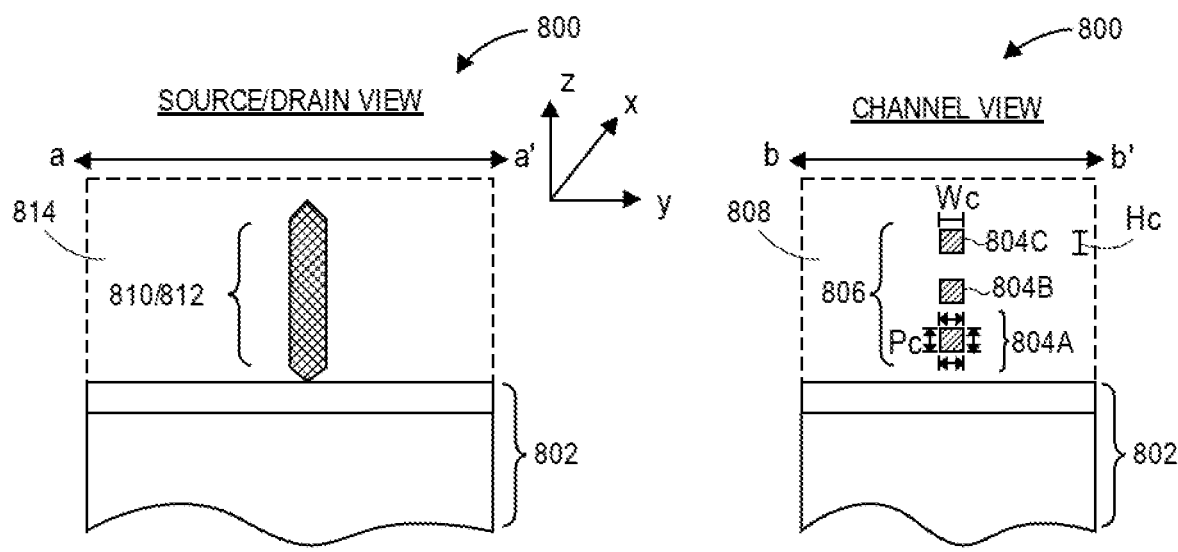
FIG. 8B  FIG. 8C

GATE-ALL-AROUND INTEGRATED CIRCUIT STRUCTURES HAVING OXIDE SUB-FINS

TECHNICAL FIELD

Embodiments of the disclosure are in the field of integrated circuit structures and processing and, in particular, gate-all-around integrated circuit structures having oxide sub-fins, and methods of fabricating gate-all-around integrated circuit structures having oxide sub-fins.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and because they enable a less complicated tri-gate fabrication process. In another aspect, maintaining mobility improvement and short channel control as microelectronic device dimensions scale below the 10 nanometer (nm) node provides a challenge in device fabrication. Nanowires used to fabricate devices provide improved short channel control.

Scaling multi-gate and nanowire transistors has not been without consequence, however. As the dimensions of these fundamental building blocks of microelectronic circuitry are reduced and as the sheer number of fundamental building blocks fabricated in a given region is increased, the constraints on the lithographic processes used to pattern these building blocks have become overwhelming. In particular, there may be a trade-off between the smallest dimension of a feature patterned in a semiconductor stack (the critical dimension) and the spacing between such features.

BRIEF DESCRIPTION OF THE DRAWINGS

FIG. 8A illustrates a three-dimensional cross-sectional view of a nanowire-based integrated circuit structure, in accordance with an embodiment of the present disclosure.

FIG. 8B illustrates a cross-sectional source or drain view of the nanowire-based integrated circuit structure of FIG. 8A, as taken along the a-a' axis, in accordance with an embodiment of the present disclosure.

FIG. 8C illustrates a cross-sectional channel view of the nanowire-based integrated circuit structure of FIG. 8A, as taken along the b-b' axis, in accordance with an embodiment of the present disclosure.

DESCRIPTION OF THE EMBODIMENTS

Figure 1A:
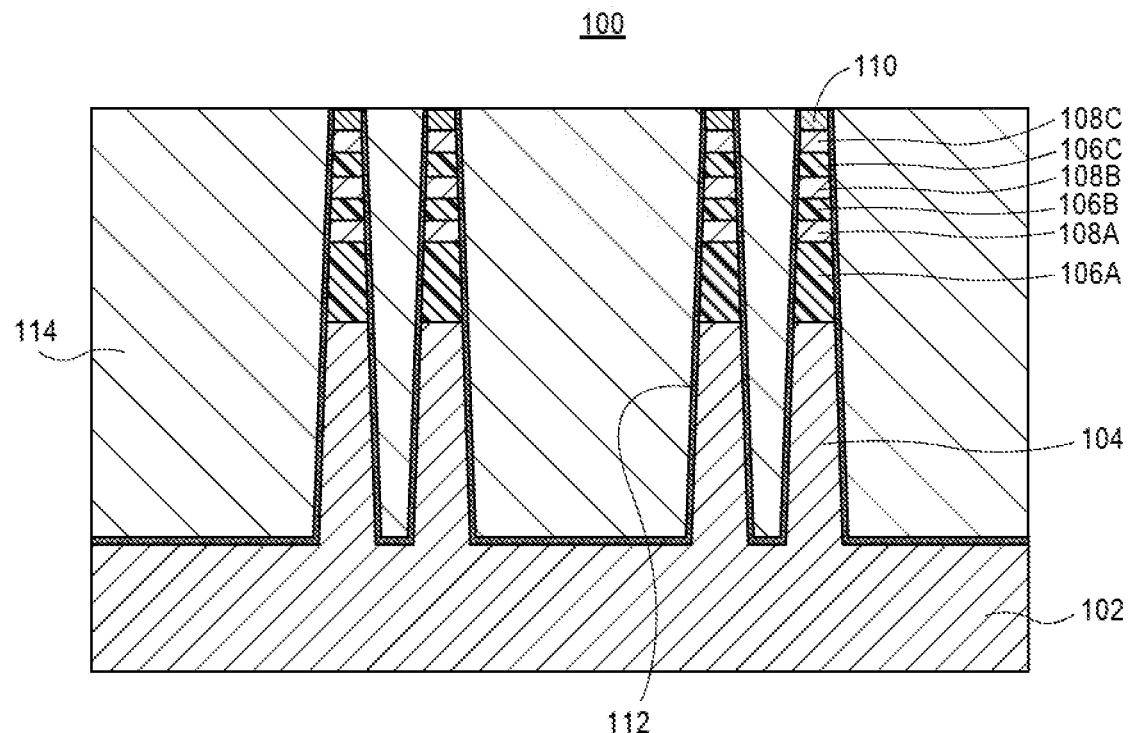
FIGS. 1A, 1B and 2 illustrate cross-sectional views representing various operations in a method of fabricating a gate-all-around integrated circuit structure having an oxide sub-fin structure, in accordance with an embodiment of the present disclosure.

Gate-all-around integrated circuit structures having oxide sub-fins, and methods of fabricating gate-all-around integrated circuit structures having oxide sub-fins, are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments described herein are directed to catalytic oxidation of sub-fin structures for nanowire transistor and nanoribbon transistor fabrication, and structures resulting from such oxidation processes. One or more embodiments may be implemented to achieve sub-fin isolation from a device in source and drain and/or gate locations.

To provide context, isolating a sub-fin from a device can significantly improve transistor performance. One or more embodiments described herein are directed to sub-fin isolation. For sub-fin isolation, sub-fin implants have been used to dope a sub-fin to reduce leakage. However, sub-fin dopants must be targeted and can back-diffuse into the channel, degrading carrier transport. Embodiments may be implemented to provide for transistor isolation from sub-fin conduction. Detection of the implementation of embodiments described herein may include, but are not limited to, the presence of a sub-fin catalyst material on an oxide sub-fin structure and/or a geometry change of an oxide sub-fin structure versus the semiconductor sub-fin structure precursor.

In accordance with an embodiment of the present disclosure, nanowire processing of an alternating Si/SiGe stack includes patterning the stack into fins. Generic dummy gates (which may or may not be polysilicon dummy gates) are patterned and etched. During a replacement gate process, nanowire or nanoribbon (NW/NR) channels are released in an opened gate trench. Prior to or following NW/NR channel release, a thin film oxidation catalysts layer (e.g., $Al_2O_3$) is deposited on the NW/NR channels, e.g., using an atomic layer deposition (ALD) process. In a particular embodiment, a masking film (such as a carbon hardmask (CHM)) is then deposited to fill the gate trench, followed by a recess etch to leave CHM covering a sub-fin structure to be converted into oxide. The oxidation catalyst layer is then removed from the exposed nanowires or ribbons using a selective wet etchant such as dilute hydrogen fluoride or aqueous ammonium hydroxide-peroxide solution. The hardmask is then subsequently removed by exposing it to oxygen plasma to leave the oxidation catalyst layer (e.g., $Al_2O_3$) encapsulating only the sub-fin structure. The sub-fin structure is then selectively converted into an oxide (e.g., a silicon oxide from oxidizing a silicon sub-fin structure) by subjecting them to a wet oxidation anneal. Since the oxidation catalyst layer (e.g., $Al_2O_3$) promotes oxygen diffusion into silicon (Si), the sub-fin structure is rapidly converted to oxide (e.g., $SiO_2$).

The oxidation condition selected may be very mild such that little oxidation occurs on the overlying wires or ribbons that are not encapsulated by the oxidation catalysts layer. Although some embodiments describe the use of Si (wire or ribbon) and SiGe (sacrificial) layers, other pairs of semiconductor materials which can be alloyed and grown epitaxially could be implemented to achieve various embodiments herein, for example, InAs and InGaAs, or SiGe and Ge. Embodiments described herein may enable the fabrication of self-aligned oxide sub-fin structures, and methods to achieve such structures.

In accordance with an embodiment of the present disclosure, a method of fabricating an integrated circuit structure includes forming a vertical arrangement of nanowires (or nanoribbons) above a semiconductor sub-fin structure. The sub-fin structure is oxidized using an oxidation catalyst layer to form an oxide sub-fin structure. A gate stack is formed around the vertical arrangement of nanowires and over the oxide sub-fin structure. In one embodiment, the method involves adding a catalyst liner after fin patterning, recessing the catalyst liner to a sub-fin structure, and then performing fin oxidation following nano-wire/ribbon release. In another embodiment, the method involves adding a catalyst on a sub-fin structure after NW/NR release, and then oxidizing the sub-fin structure.

Figure 1B:
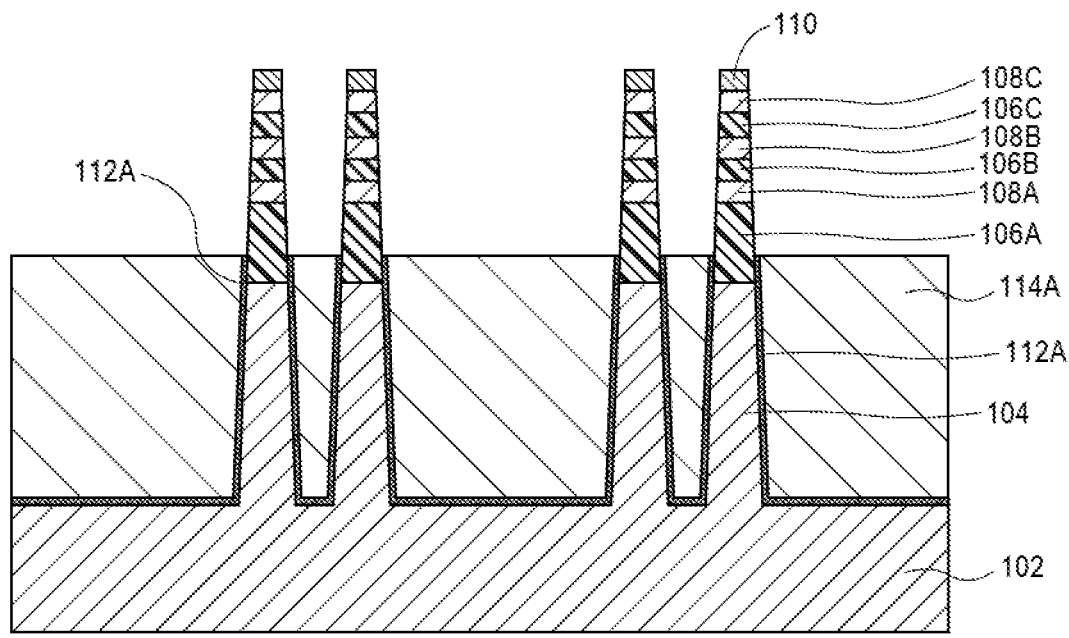
Figure 2:
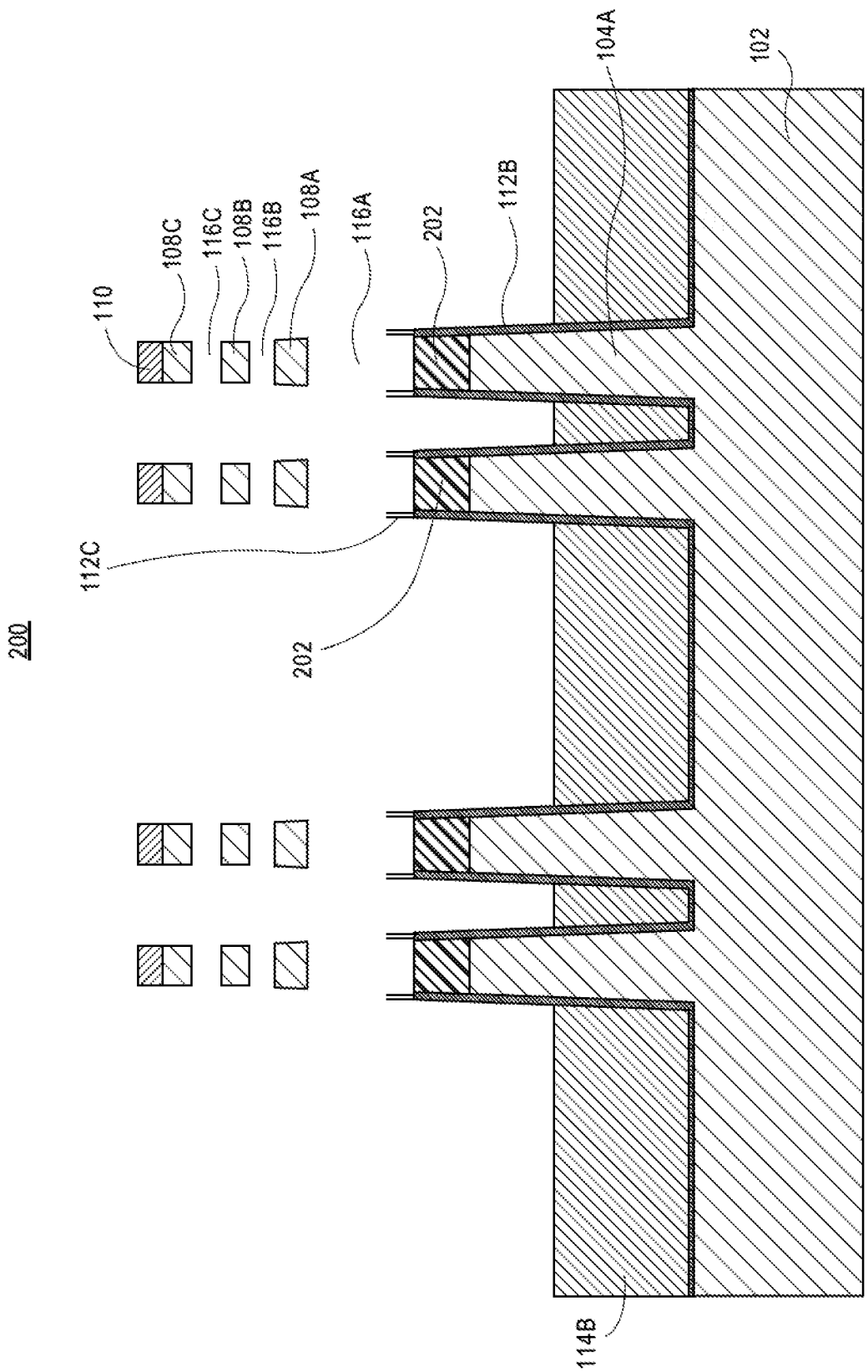

In an example where an oxidation catalyst layer is formed prior to removing a sacrificial release material interleaved with a vertical arrangement of nanowires, FIGS. 1A, 1B and 2 illustrate cross-sectional views representing various operations in a method of fabricating a gate-all-around integrated circuit structure having an oxide sub-fin structure, in accordance with an embodiment of the present disclosure.

Referring to part FIG. 1A, a method of fabricating an integrated circuit structure includes forming a vertical arrangement of nanowires or nanoribbons above a substrate to provide a starting structure 100. For example, a set of nanowires 108A, 108B and 108C (such as silicon nanowires) with interleaved sacrificial material 106A, 106B and 106C (such as silicon germanium sacrificial layers) are provided as a vertical stack which may be referred to as an upper fin portion. The upper fin portion may be patterned together with a lower or sub-fin portion 104 (such as a silicon sub-fin portion), which may protrude from a substrate 102, such as a silicon substrate. An upper protective cap layer 110 may be included on the upper fin portion, as is depicted.

Referring again to FIG. 1A, following fin patterning, an oxidation catalyst layer 112 is formed over the fin structure. A dielectric layer 114 is then formed over the oxidation catalyst layer 112. The dielectric layer 114 and the oxidation catalyst layer 112 may then be planarized using the upper protective cap layer 110 as a planarization stop. In one embodiment, the oxidation catalyst layer 112 is or includes aluminum oxide. In another embodiment, the oxidation catalyst layer 112 is or includes lanthanum oxide.

Referring to FIG. 1B, the oxidation catalyst layer 112 is recessed to confine the oxidation catalyst layer 112 to a location below the nanowires 108A, 108B and 108C, but adjacent the sub-fin structure 104. In an embodiment, the dielectric layer 114 recessed to the location to form recessed dielectric 114A. The portions of oxidation catalyst layer 112 not covered by the recessed dielectric 114A are then removed to form oxidation catalyst portions 112A. It is to be appreciated that the cross-section shown in FIG. 1B may be taken through a gate trench opened during a replacement gate process such that channel regions are shown in FIG. 1B.

Referring to FIG. 2, the interleaved sacrificial material 106A, 106B and 106C is removed to form corresponding cavities 116A, 116B and 116C, respectively. Following removal of the interleaved sacrificial material 106A, 106B and 106C, an oxidation process is then performed. In an embodiment, the oxidation process is a process that can oxidize silicon but at a rate that is substantially enhanced by the presence of oxidation catalyst portions 112A. In one such embodiment, the oxidation process is enhanced to rapidly oxidize at least an upper portion of sub-fin 104 to form oxide sub-fin 202 without oxidizing (or only very minimally oxidizing) nanowires 108A, 108B and 108C. The oxide sub-fin 202 may be an oxide sub-fin structure above non-oxidized or only partially oxidized sub-fin portions 104A, as is depicted.

The process of first removing the interleaved sacrificial material 106A, 106B and 106C and then performing the oxidation catalyst may leave residual/broken oxidation catalyst portions 112C (which may later be removed or cleaned away in a wet clean, e.g., prior to permanent gate structure formation), and permanent oxidation catalyst portions 112B (which may be retained in a final structure indicative of such an oxidation approach). In an embodiment, the oxidation process involves a wet oxidation anneal, e.g., heating the structure in the presence of water or water vapor. In an embodiment, the volume of the silicon oxide or silicon dioxide of the sub-fin structure 202 is approximately 30% greater than the volume of the starting silicon structure due to expansion of the film upon incorporation of oxygen.

It is to be appreciated that following the processing described in association with FIGS. 1A, 1B and 2, a permanent gate structure may be fabricated around nanowires 108A, 108B and 108C and over oxide sub-fin structure 202. The process may be formed subsequent to removal of upper protective cap layer 110, or in the present of upper protective cap layer 110 in the case that upper protective cap layer 110 is retained. In an embodiment, the permanent gate structure includes a gate dielectric and gate electrode. In an embodiment, the remaining oxidation catalyst layer 112B is not removed, and oxidation catalyst layer 112B is included in the final structure. In other embodiments, however, the oxidation catalyst layer 112B (or an exposed portion of the oxidation catalyst layer 112B) is removed prior to permanent gate structure fabrication.

Referring again to FIG. 2 and the associated description above, in accordance with an embodiment of the present disclosure, an integrated circuit structure 200 includes an oxide sub-fin structure 202 having a top and sidewalls. An oxidation catalyst layer 112B is on the sidewalls but not on the top of the oxide sub-fin structure 202. A vertical arrangement of nanowires 108A, 108B and 108C is above the oxide sub-fin structure 202. In an embodiment, the oxidation catalyst layer 112B includes aluminum oxide. In an embodiment, the oxidation catalyst layer 112B includes lanthanum oxide.

A gate stack is surrounding the vertical arrangement of nanowires and on the top of the oxide sub-fin structure 202. In an embodiment, the gate stack includes a high-k gate dielectric layer and a metal gate electrode.

In an embodiment, the integrated circuit structure 200 further includes epitaxial source or drain structures at ends of the vertical arrangement of nanowires 108A, 108B and 108C. Examples of such source or drain structures are described in greater detail below. In one embodiment, the epitaxial source or drain structures are discrete epitaxial source or drain structures. In another embodiment, the epitaxial source or drain structures are non-discrete epitaxial source or drain structures. In another embodiment, the gate stack has dielectric sidewall spacers, and the epitaxial source or drain structures are embedded epitaxial source or drain structures extending beneath the dielectric sidewall spacers of the gate stack.

In an embodiment, the integrated circuit structure 200 further includes a pair of conductive contact structures coupled to epitaxial source or drain structures. Examples of such conductive contact structures are described in greater detail below. In one embodiment, the pair of conductive contact structures is an asymmetric pair of conductive contact structures.

In an example where an oxidation catalyst layer is formed subsequent to removing a sacrificial release material interleaved with a vertical arrangement of nanowires, FIGS. 3A-3F illustrate cross-sectional views representing various operations in a method of fabricating a gate-all-around integrated circuit structure having an oxide sub-fin structure, in accordance with an embodiment of the present disclosure. For each operation, a fin cut and corresponding gate cut are depicted.

Figure 3A:
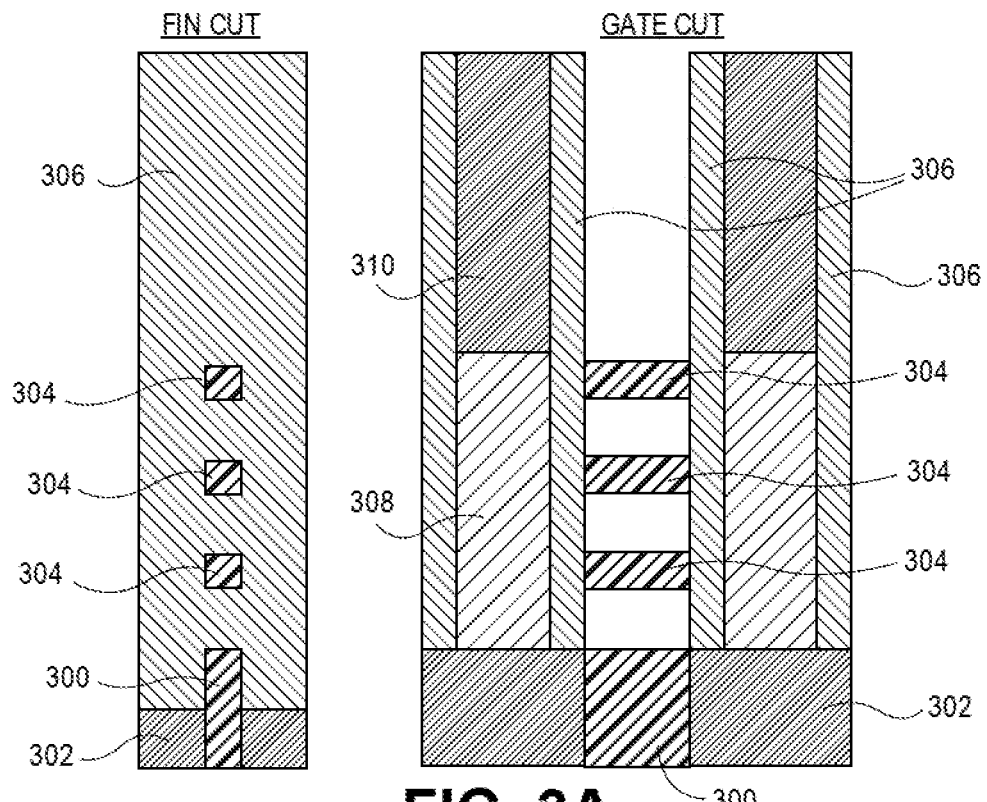
FIGS. 3A-3F illustrate cross-sectional views representing various operations in a method of fabricating a gate-all-around integrated circuit structure having an oxide sub-fin structure, in accordance with an embodiment of the present disclosure.

Referring to FIG. 3A, a method of fabricating an integrated circuit structure includes forming a vertical arrangement of nanowires or nanoribbons above a substrate. For example, a set of nanowires 304 is provided as a vertical stack following removal of interleaving sacrificial release layers. As explained in greater detail in other embodiments described below, channel regions of the nanowires 304 may be exposed during a replacement gate process during which an open trench is formed, such as an open trench formed in a dielectric layer or within dielectric gate spacers 306. In the example of FIG. 3A, nanowires 304 are above a sub-fin 300, such as a silicon sub-fin. The sub-fin 300 protrudes through an isolation layer 302. A sacrificial or permanent trench contact stack is over source or drain locations. In one embodiment, a trench contact placeholder dielectric layer 308 has a hardmask or cap layer 310 thereon.

Figure 3B:
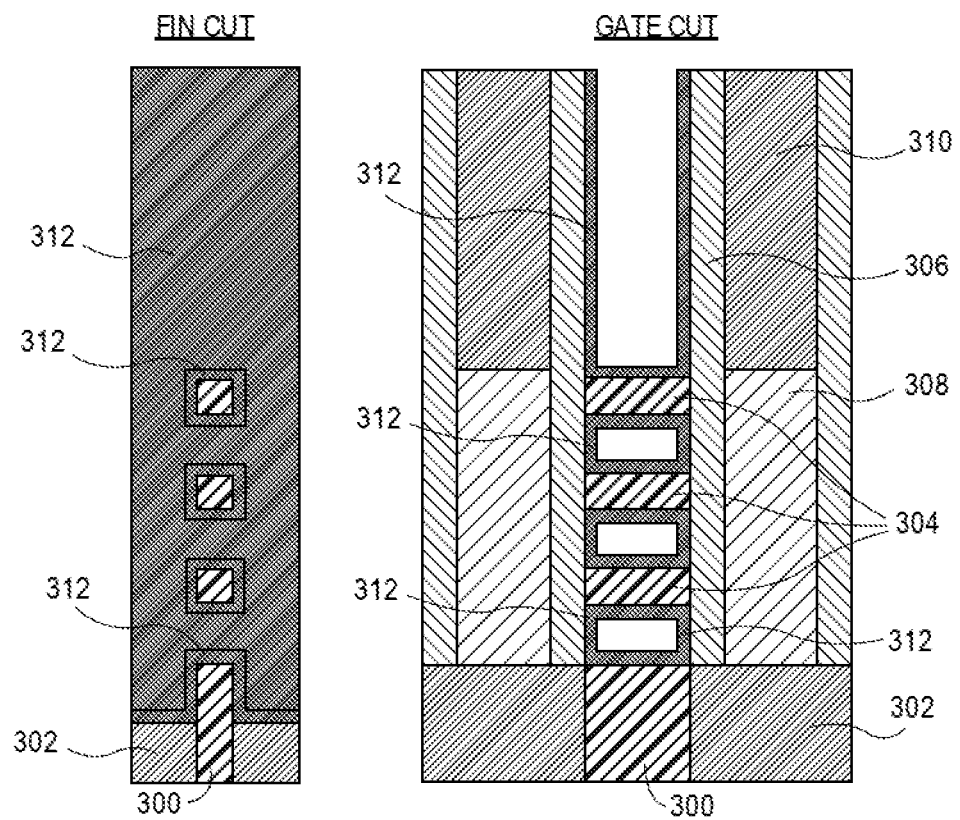

Referring to FIG. 3B, an oxidation catalyst layer 312 is formed in the trench, on the nanowires 304 and on the sub-fin 300. In one embodiment, the oxidation catalyst layer 312 is further formed along surfaces of the trench, e.g., along gate spacers 306, as is depicted. In one embodiment, the oxidation catalyst layer 312 is or includes aluminum oxide. In another embodiment, the oxidation catalyst layer 312 is or includes lanthanum oxide.

Figure 3C:
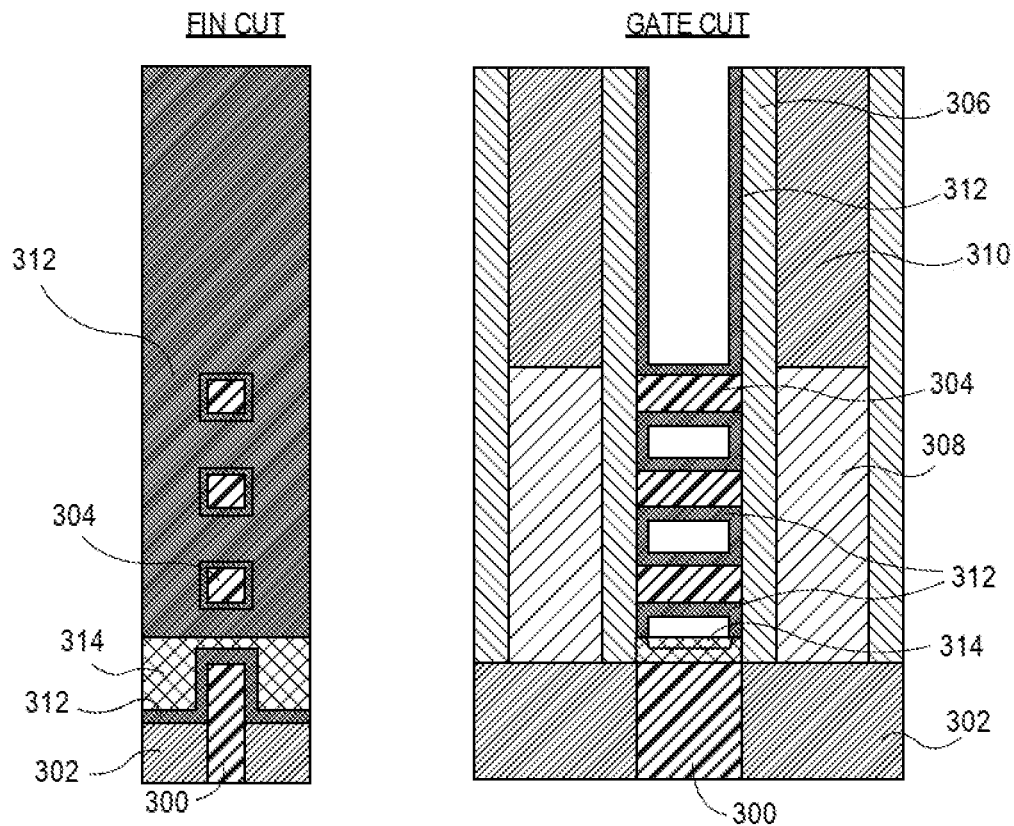
Figure 3D:
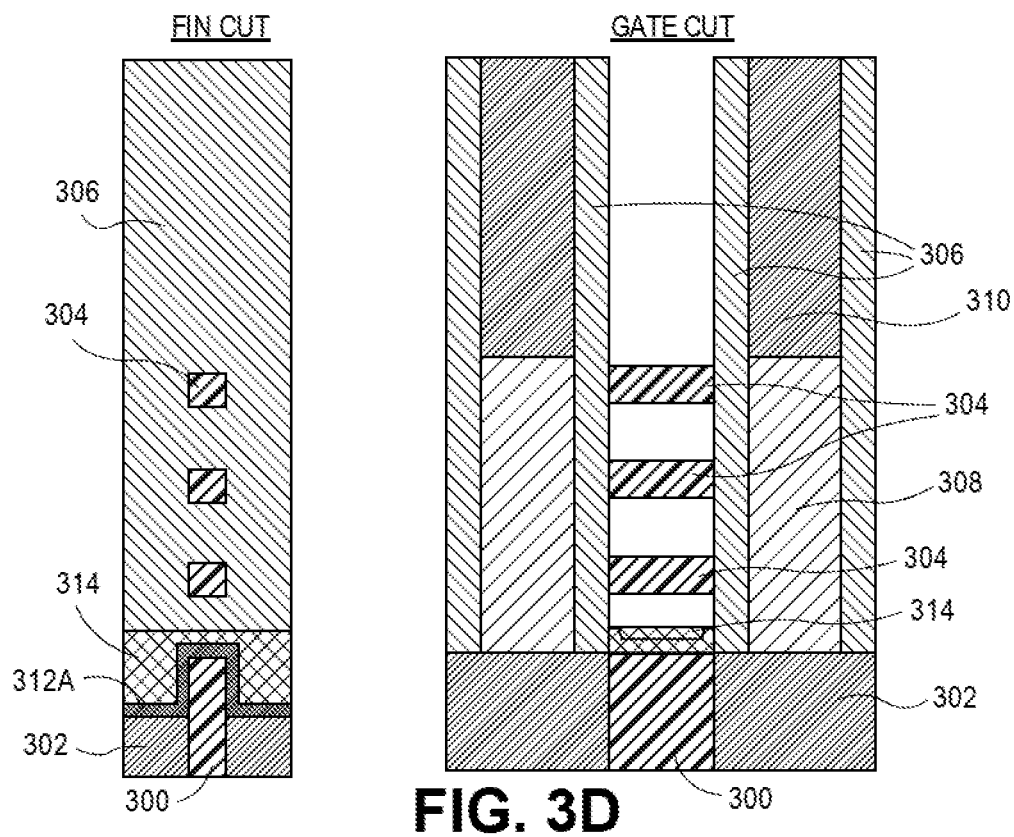
Figure 3E:
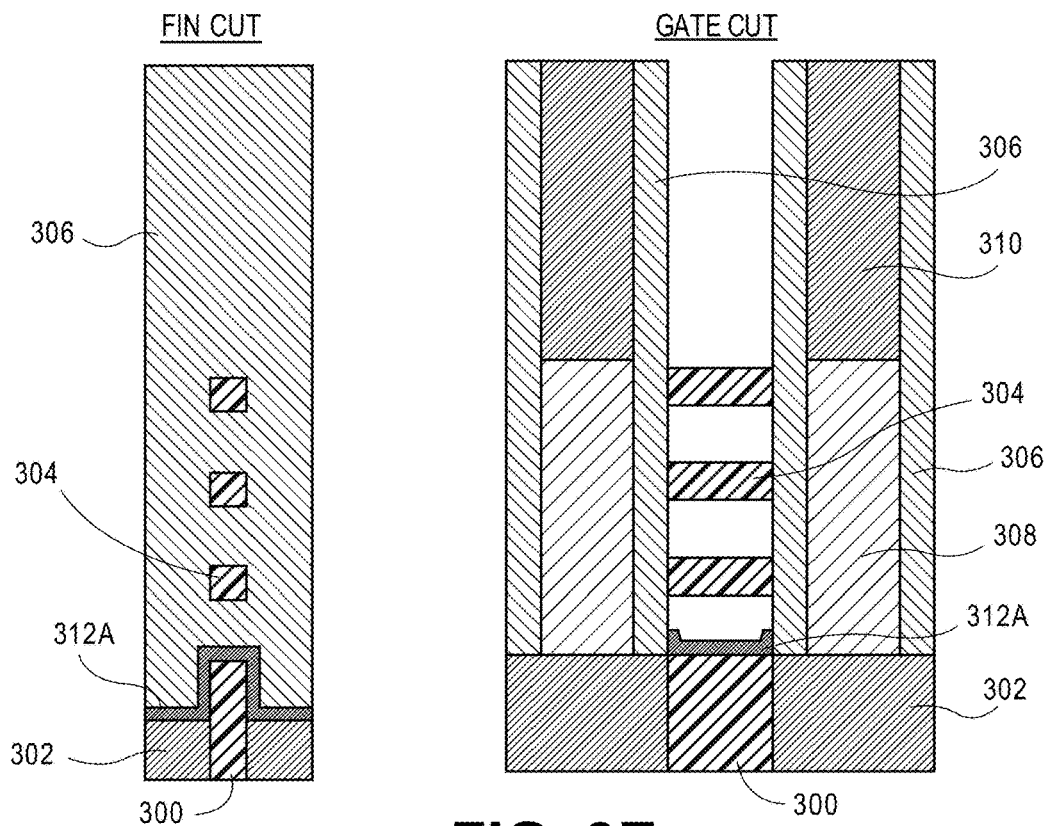

Referring to FIGS. 3C and 3D, the oxidation catalyst layer 312 is patterned to confine the oxidation catalyst layer 312 only to the sub-fin 300. In an embodiment, a hardmask layer 314, such as a carbon-based hardmask layer, is formed in on oxidation catalyst layer 312. The hardmask layer 314 is then recessed to a level slightly above the sub-fin 300. The portions of oxidation catalyst layer 312 not covered by the recessed hardmask layer 314 are then removed to form oxidation catalyst portion 312A. Referring to FIG. 3E, the recessed hardmask layer 314 is then removed.

Figure 3F:
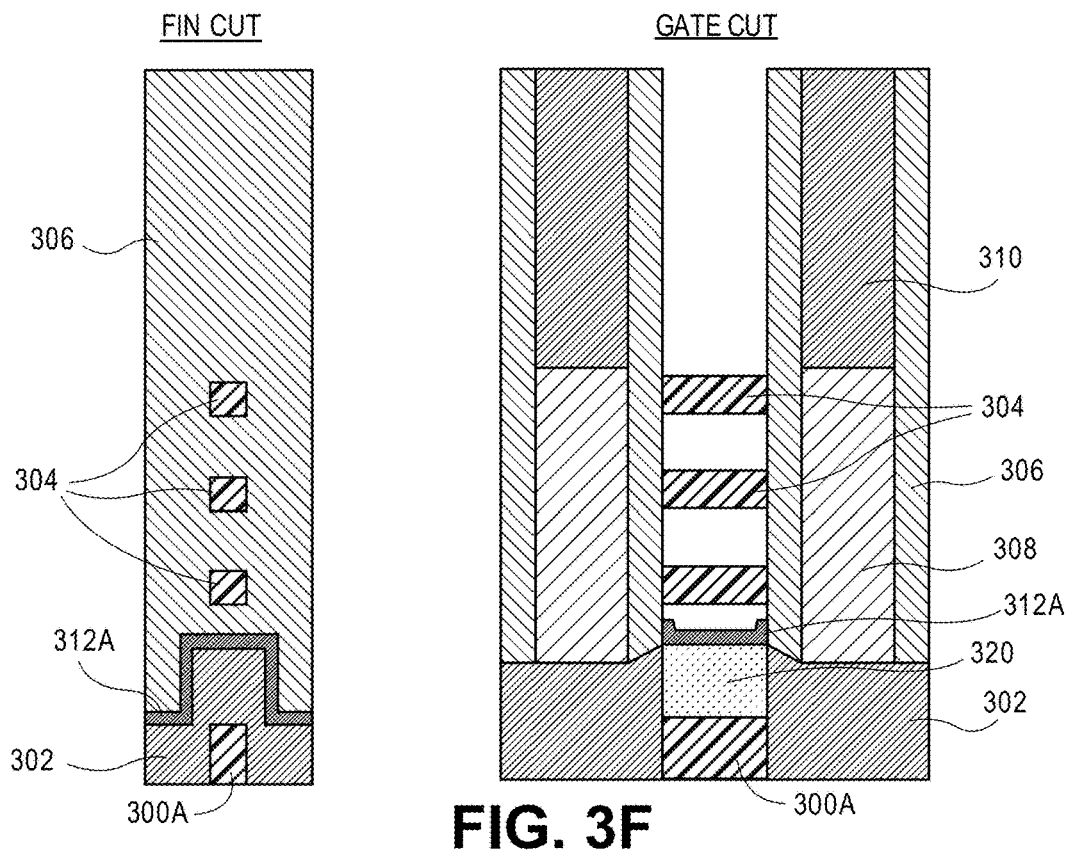

Referring to FIG. 3F, an oxidation process is then performed to form oxide sub-fin 320, which may be above a non-oxidized remaining sub-fin portion 300A. In an embodiment, the oxidation process is a process that can oxidize silicon but at a rate that is substantially enhanced by the presence of oxidation catalyst portion 312A. In one such embodiment, the oxidation process is enhanced to rapidly oxidize sub-fin 320 without oxidizing (or only very minimally oxidizing) nanowires 304. In an embodiment, the oxidation process involves a wet oxidation anneal, e.g., heating the structure in the presence of water or water vapor. In an embodiment, the volume of the silicon oxide or silicon dioxide of oxide sub-fin 320 is approximately 30% greater than the volume of the initial sub-fin material due to expansion of the film upon incorporation of oxygen.

It is to be appreciated that following the processing described in association with FIGS. 3A-3F, a permanent gate structure may be fabricated around nanowires 304 and over oxide sub-fin structure 320. In an embodiment, the permanent gate structure includes a gate dielectric and gate electrode. In an embodiment, the remaining oxidation catalyst layer 312A is not removed, and oxidation catalyst layer 312A is included in the final structure. In other embodiments, however, the oxidation catalyst layer 312A (or an exposed portion of the oxidation catalyst layer 312A) is removed prior to permanent gate structure fabrication.

Referring again to FIG. 3F and the associated description above, in accordance with an embodiment of the present disclosure, an integrated circuit structure includes an oxide sub-fin structure 320 having a top and sidewalls. An oxidation catalyst layer 312A is on the top and sidewalls of the oxide sub-fin structure 320. A vertical arrangement of nanowires 304 is above the oxide sub-fin structure 320. A gate stack is surrounding the vertical arrangement of nanowires 304 and is on at least the portion of the oxidation catalyst layer 312A on the top of the oxide sub-fin structure 320.

In an embodiment, the oxidation catalyst layer 312A includes aluminum oxide. In an embodiment, the oxidation catalyst layer 312A includes lanthanum oxide. In an embodiment, the gate stack includes a high-k gate dielectric layer and a metal gate electrode.

In an embodiment, the integrated circuit structure further includes epitaxial source or drain structures at ends of the vertical arrangement of nanowires 304. Examples of such source or drain structures are described in greater detail below. In one embodiment, the epitaxial source or drain structures are discrete epitaxial source or drain structures. In another embodiment, the epitaxial source or drain structures are non-discrete epitaxial source or drain structures. In another embodiment, the gate stack has dielectric sidewall spacers, and the epitaxial source or drain structures are embedded epitaxial source or drain structures extending beneath the dielectric sidewall spacers of the gate stack.

In an embodiment, the integrated circuit structure further includes a pair of conductive contact structures coupled to epitaxial source or drain structures. Examples of such conductive contact structures are described in greater detail below. In one embodiment, the pair of conductive contact structures is an asymmetric pair of conductive contact structures.

As mentioned above, nanowire release processing may be performed through a replacement gate trench. Examples of such release processes are described below. Additionally, in another aspect, backend (BE) interconnect scaling can result in lower performance and higher manufacturing cost due to patterning complexity. Embodiments described herein may be implemented to enable front and backside interconnect integration for nanowire transistors. Embodiments described herein may provide an approach to achieve a relatively wider interconnect pitch. The result may be improved product performance and lower patterning costs. Embodiments may be implemented to enable robust functionality of scaled nanowire or nanoribbon transistors with low power and high performance.

One or more embodiments described herein are directed dual epitaxial (EPI) connections for nanowire or nanoribbon transistors using partial source or drain (SD) and asymmetric trench contact (TCN) depth. In an embodiment, an integrated circuit structure is fabricated by forming source-drain openings of nanowire/nanoribbon transistors which are partially filled with SD epitaxy. A remainder of the opening is filled with a conductive material. Deep trench formation on one of the source or drain side enables direct contact to a backside interconnect level.

In an exemplary process flow, FIGS. 4A-4J illustrates cross-sectional views of various operations in a method of fabricating a gate-all-around integrated circuit structure, in accordance with an embodiment of the present disclosure.

Figure 4B:
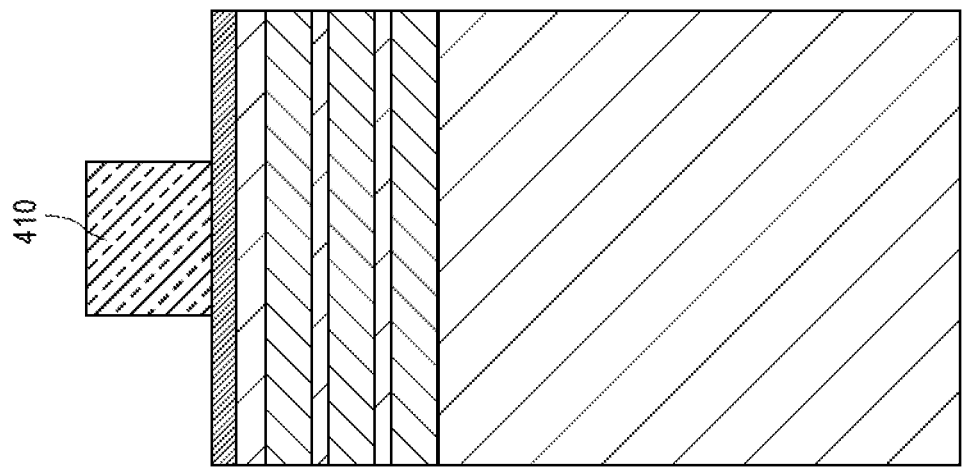
FIGS. 4A-4J illustrates cross-sectional views of various operations in a method of fabricating a gate-all-around integrated circuit structure, in accordance with an embodiment of the present disclosure.
Figure 4A:
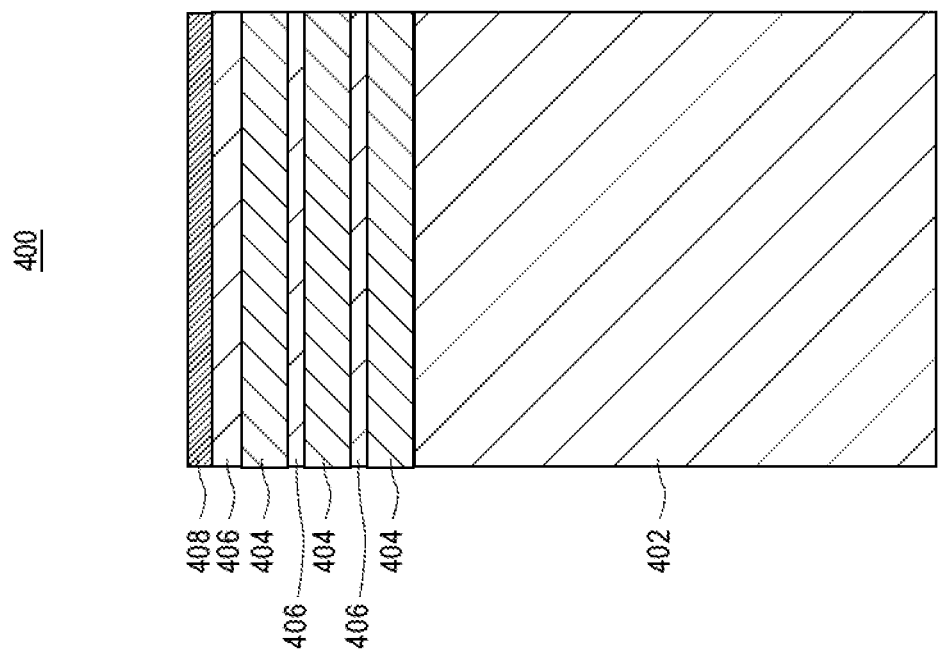

Referring to FIG. 4A, a method of fabricating an integrated circuit structure includes forming a starting stack 400 which includes alternating silicon germanium layer 404 and silicon layers 406 above a fin 402, such as a silicon fin. The silicon layers 406 may be referred to as a vertical arrangement of silicon nanowires. A protective cap 408 may be formed above the alternating silicon germanium layer 404 and silicon layers 406, as is depicted.

Figure 4C:
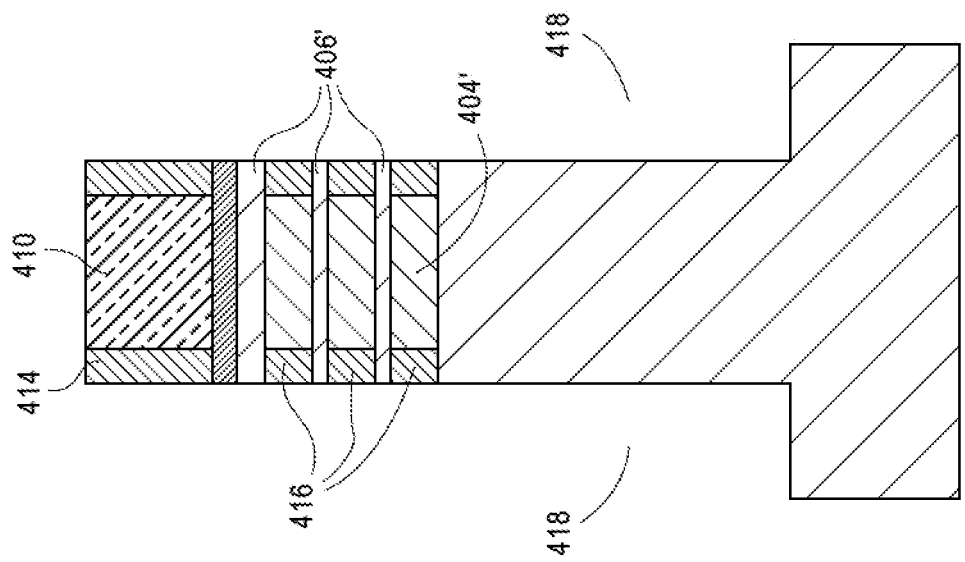

Referring to FIG. 4B, a gate stack 410 is formed over the vertical arrangement of nanowires 406. Portions of the vertical arrangement of nanowires 406 are then released by removing portions of the silicon germanium layer 404 to provide recessed silicon germanium layers 404' and cavities 412, as is depicted in FIG. 4C.

It is to be appreciated that the structure of FIG. 4C may be fabricated to completion without first performing the deep etch and asymmetric contact processing described below in association with FIG. 4D. In either case (e.g., with or without asymmetric contact processing), in an embodiment, a fabrication process involves use of a process scheme that provides a gate-all-around integrated circuit structure having an oxide sub-fin structure, examples of which are described above in association with FIGS. 2 and 3F.

Figure 4D:
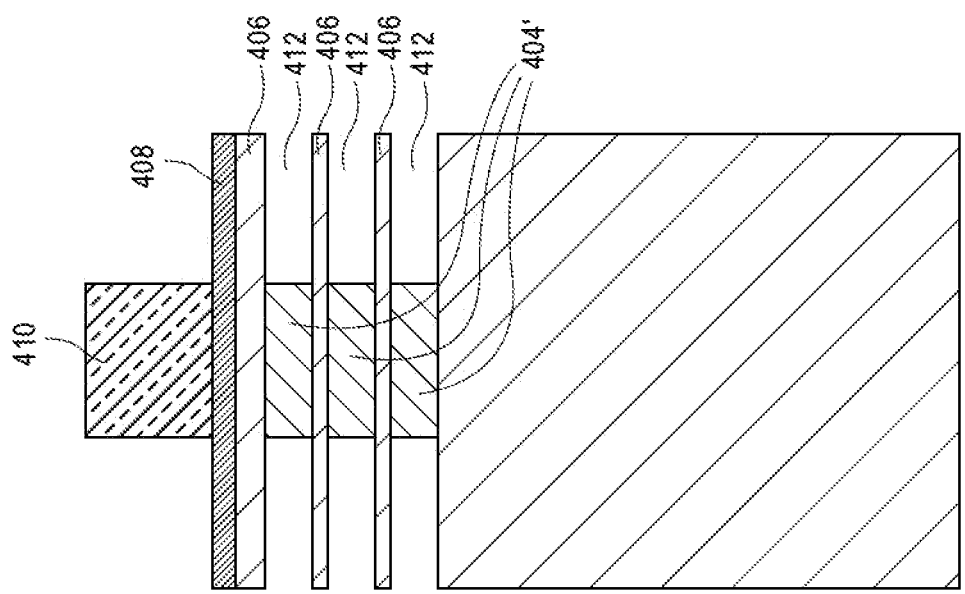
Figure 4E:
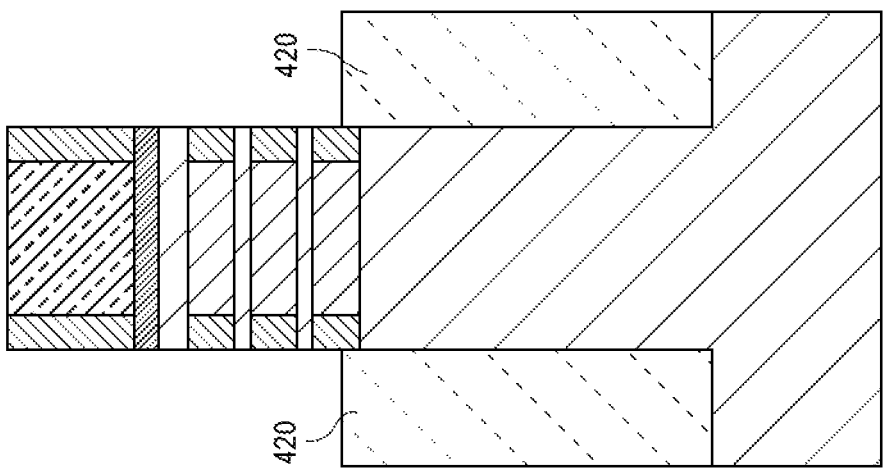

Referring to FIG. 4D, upper gate spacers 414 are formed at sidewalls of the gate structure 410. Cavity spacers 416 are formed in the cavities 412 beneath the upper gate spacers 414. A deep trench contact etch is then performed to form trenches 418 and to formed recessed nanowires 406'. A sacrificial material 420 is then formed in the trenches 418, as is depicted in FIG. 4E.

Figure 4F:
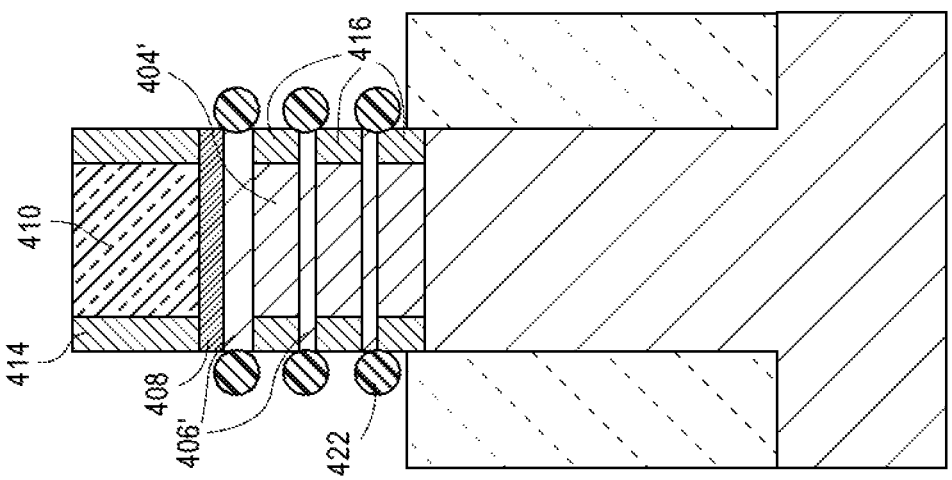
Figure 4G:
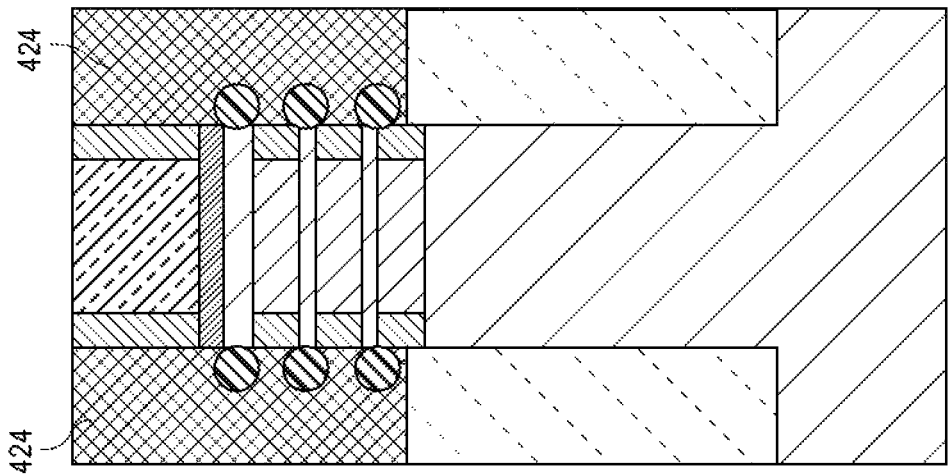

Referring to FIG. 4F, a first epitaxial source or drain structure (e.g., left-hand features 422) is formed at a first end of the vertical arrangement of nanowires 406'. A second epitaxial source or drain structure (e.g., right-hand features 422) is formed at a second end of the vertical arrangement of nanowires 406'. An inter-layer dielectric (ILD) material 424 is then formed at the sides of the gate electrode 410 and adjacent the source or drain structures 422, as is depicted in FIG. 4G.

Figure 4J:
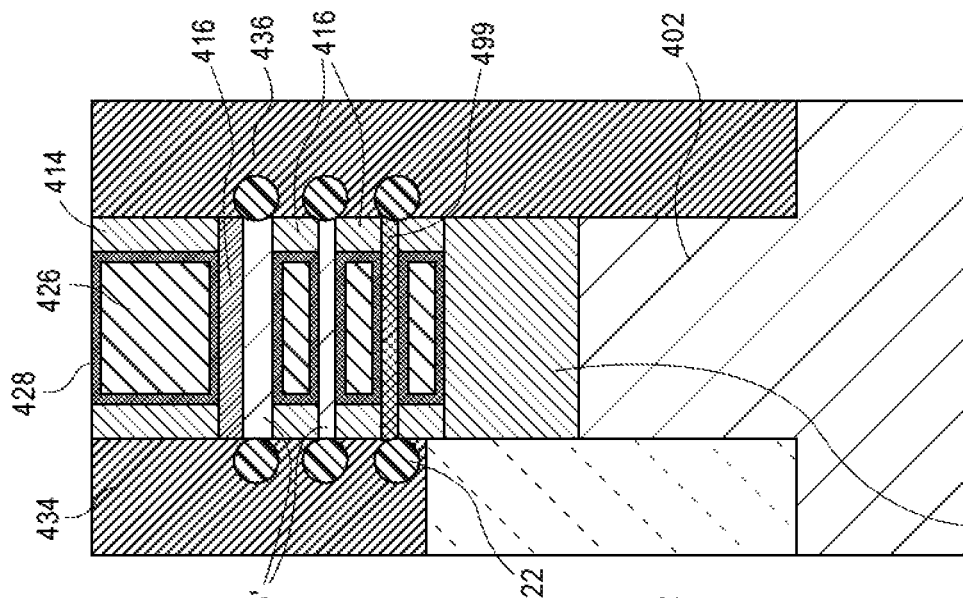
Figure 4I:
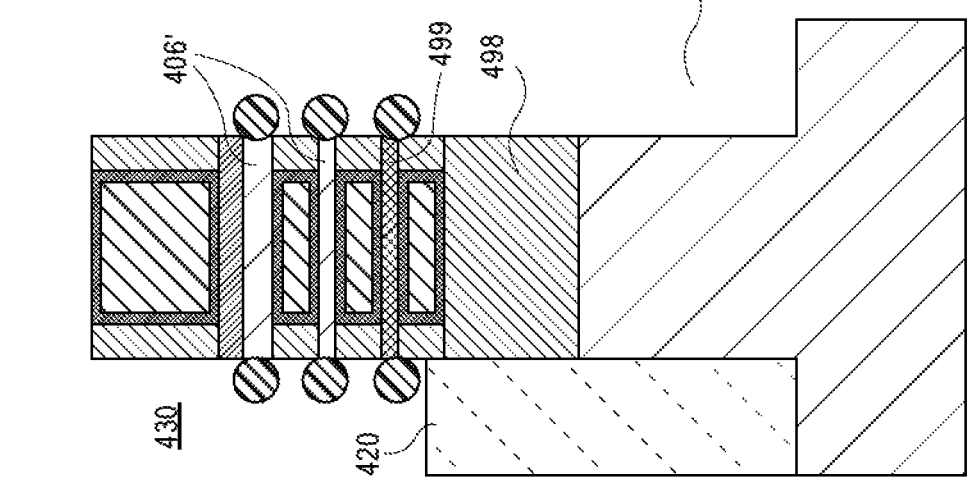
Figure 4H:
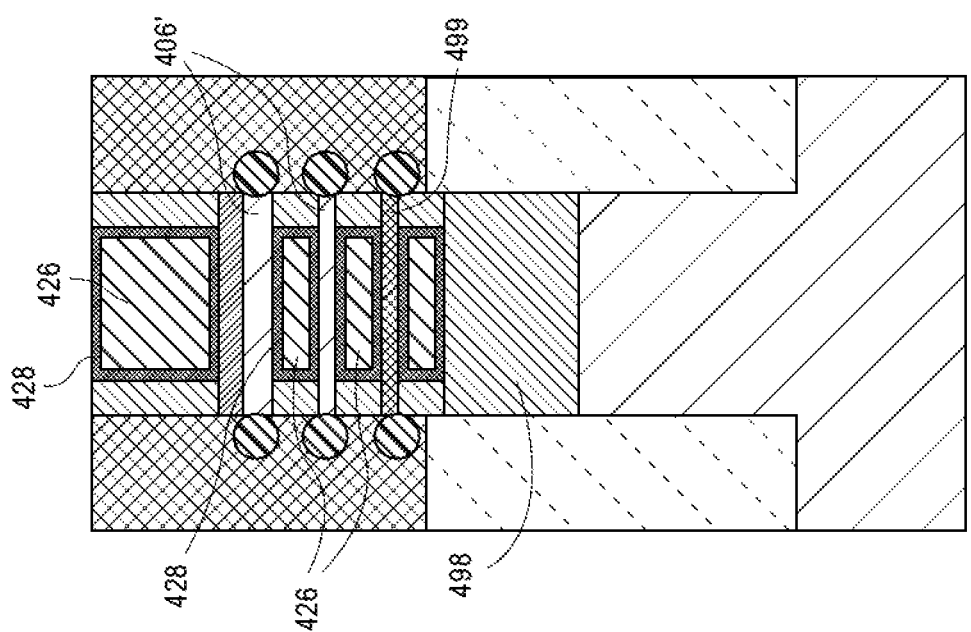

Referring to FIG. 4H, a replacement gate process is used to form a permanent gate dielectric 428 and a permanent gate electrode 426. In an embodiment, subsequent to removal of gate structure 410 and prior to forming permanent gate dielectric 428 and permanent gate electrode 426, the recessed silicon germanium layers 404' are removed to leave upper active nanowires or nanoribbons 406'. In an embodiment, the recessed silicon germanium layers 404' are removed selectively with a wet etch that selectively removes the silicon germanium while not etching the silicon layers. Etch chemistries such as carboxylic acid/nitric acid/HF chemistry, and citric acid/nitric acid/HF, for example, may be utilized to selectively etch the silicon germanium. Halide-based dry etches or plasma-enhanced vapor etches may also be used to achieve the embodiments herein.

Referring again to FIG. 4H, an oxide sub-fin structure 498 is formed. In one embodiment, the oxide sub-fin structure 498 is formed using an oxidation catalyst layer, such as described above. In a particular embodiment, the oxidation catalyst layer may further be used to selectively oxidize one or more of the bottommost nanowires or nanoribbons 406' to form one or more oxide nanowire or nanoribbons 499, e.g., for selective channel depopulation. The permanent gate dielectric 428 and a permanent gate electrode 426 is then formed to surround the nanowires or nanoribbons 406', and on the oxide sub-fin structure 498.

Referring to FIG. 4I, the ILD material 424 is then removed. The sacrificial material 420 is then removed from one of the source drain locations (e.g., right-hand side) to form trench 432, but is not removed from the other of the source drain locations to form trench 430.

Referring to FIG. 4J, a first conductive contact structure 434 is formed coupled to the first epitaxial source or drain structure (e.g., left-hand features 422). A second conductive contact structure 436 is formed coupled to the second epitaxial source or drain structure (e.g., right-hand features 422). The second conductive contact structure 436 is formed deeper along the fin 402 than the first conductive contact structure 434. In an embodiment, although not depicted in FIG. 4J, the method further includes forming an exposed surface of the second conductive contact structure 436 at a bottom of the fin 402.

In an embodiment, the second conductive contact structure 436 is deeper along the fin 402 than the first conductive contact structure 434, as is depicted. In one such embodiment, the first conductive contact structure 434 is not along the fin 402, as is depicted. In another such embodiment, not depicted, the first conductive contact structure 434 is partially along the fin 402.

In an embodiment, the second conductive contact structure 436 is along an entirety of the fin 402. In an embodiment, although not depicted, in the case that the bottom of the fin 402 is exposed by a backside substrate removal process, the second conductive contact structure 436 has an exposed surface at a bottom of the fin 402.

In another aspect, in order to enable access to both conductive contact structures of a pair of asymmetric source and drain contact structures, integrated circuit structures described herein may be fabricated using a back-side reveal of front-side structures fabrication approach. In some exemplary embodiments, reveal of the back-side of a transistor or other device structure entails wafer-level back-side processing. In contrast to a conventional through-Silicon via TSV-type technology, a reveal of the back-side of a transistor as described herein may be performed at the density of the device cells, and even within sub-regions of a device. Furthermore, such a reveal of the back-side of a transistor may be performed to remove substantially all of a donor substrate upon which a device layer was disposed during front-side device processing. As such, a microns-deep TSV becomes unnecessary with the thickness of semiconductor in the device cells following a reveal of the back-side of a transistor potentially being only tens or hundreds of nanometers.

Reveal techniques described herein may enable a paradigm shift from "bottom-up" device fabrication to "center-out" fabrication, where the "center" is any layer that is employed in front-side fabrication, revealed from the back side, and again employed in back-side fabrication. Processing of both a front side and revealed back side of a device structure may address many of the challenges associated with fabricating 3D ICs when primarily relying on front-side processing.

A reveal of the back-side of a transistor approach may be employed for example to remove at least a portion of a carrier layer and intervening layer of a donor-host substrate assembly. The process flow begins with an input of a donor-host substrate assembly. A thickness of a carrier layer in the donor-host substrate is polished (e.g., CMP) and/or etched with a wet or dry (e.g., plasma) etch process. Any grind, polish, and/or wet/dry etch process known to be suitable for the composition of the carrier layer may be employed. For example, where the carrier layer is a group IV semiconductor (e.g., silicon) a CMP slurry known to be suitable for thinning the semiconductor may be employed. Likewise, any wet etchant or plasma etch process known to be suitable for thinning the group IV semiconductor may also be employed.

In some embodiments, the above is preceded by cleaving the carrier layer along a fracture plane substantially parallel to the intervening layer. The cleaving or fracture process may be utilized to remove a substantial portion of the carrier layer as a bulk mass, reducing the polish or etch time needed to remove the carrier layer. For example, where a carrier layer is 400-900 µm in thickness, 100-700 µm may be cleaved off by practicing any blanket implant known to promote a wafer-level fracture. In some exemplary embodiments, a light element (e.g., H, He, or Li) is implanted to a uniform target depth within the carrier layer where the fracture plane is desired. Following such a cleaving process, the thickness of the carrier layer remaining in the donor-host substrate assembly may then be polished or etched to complete removal. Alternatively, where the carrier layer is not fractured, the grind, polish and/or etch operation may be employed to remove a greater thickness of the carrier layer.

Next, exposure of an intervening layer is detected. Detection is used to identify a point when the back-side surface of the donor substrate has advanced to nearly the device layer. Any endpoint detection technique known to be suitable for detecting a transition between the materials employed for the carrier layer and the intervening layer may be practiced. In some embodiments, one or more endpoint criteria are based on detecting a change in optical absorbance or emission of the back-side surface of the donor substrate during the polishing or etching performed. In some other embodiments, the endpoint criteria are associated with a change in optical absorbance or emission of byproducts during the polishing or etching of the donor substrate back-side surface. For example, absorbance or emission wavelengths associated with the carrier layer etch byproducts may change as a function of the different compositions of the carrier layer and intervening layer. In other embodiments, the endpoint criteria are associated with a change in mass of species in byproducts of polishing or etching the back-side surface of the donor substrate. For example, the byproducts of processing may be sampled through a quadrupole mass analyzer and a change in the species mass may be correlated to the different compositions of the carrier layer and intervening layer. In another exemplary embodiment, the endpoint criteria is associated with a change in friction between a back-side surface of the donor substrate and a polishing surface in contact with the back-side surface of the donor substrate.

Detection of the intervening layer may be enhanced where the removal process is selective to the carrier layer relative to the intervening layer as non-uniformity in the carrier removal process may be mitigated by an etch rate delta between the carrier layer and intervening layer. Detection may even be skipped if the grind, polish and/or etch operation removes the intervening layer at a rate sufficiently below the rate at which the carrier layer is removed. If an endpoint criteria is not employed, a grind, polish and/or etch operation of a predetermined fixed duration may stop on the intervening layer material if the thickness of the intervening layer is sufficient for the selectivity of the etch. In some examples, the carrier etch rate: intervening layer etch rate is 3:1-10:1, or more.

Upon exposing the intervening layer, at least a portion of the intervening layer may be removed. For example, one or more component layers of the intervening layer may be removed. A thickness of the intervening layer may be removed uniformly by a polish, for example. Alternatively, a thickness of the intervening layer may be removed with a masked or blanket etch process. The process may employ the same polish or etch process as that employed to thin the carrier, or may be a distinct process with distinct process parameters. For example, where the intervening layer provides an etch stop for the carrier removal process, the latter operation may employ a different polish or etch process that favors removal of the intervening layer over removal of the device layer. Where less than a few hundred nanometers of intervening layer thickness is to be removed, the removal process may be relatively slow, optimized for across-wafer uniformity, and more precisely controlled than that employed for removal of the carrier layer. A CMP process employed may, for example employ a slurry that offers very high selectively (e.g., 100:1-300:1, or more) between semiconductor (e.g., silicon) and dielectric material (e.g., SiO) surrounding the device layer and embedded within the intervening layer, for example, as electrical isolation between adjacent device regions.

For embodiments where the device layer is revealed through complete removal of the intervening layer, backside processing may commence on an exposed backside of the device layer or specific device regions there in. In some embodiments, the backside device layer processing includes a further polish or wet/dry etch through a thickness of the device layer disposed between the intervening layer and a device region previously fabricated in the device layer, such as a source or drain region.

In some embodiments where the carrier layer, intervening layer, or device layer backside is recessed with a wet and/or plasma etch, such an etch may be a patterned etch or a materially selective etch that imparts significant non-planarity or topography into the device layer back-side surface. As described further below, the patterning may be within a device cell (i.e., "intra-cell" patterning) or may be across device cells (i.e., "inter-cell" patterning). In some patterned etch embodiments, at least a partial thickness of the intervening layer is employed as a hard mask for back-side device layer patterning. Hence, a masked etch process may preface a correspondingly masked device layer etch.

The above described processing scheme may result in a donor-host substrate assembly that includes IC devices that have a back side of an intervening layer, a back side of the device layer, and/or back side of one or more semiconductor regions within the device layer, and/or front-side metallization revealed. Additional backside processing of any of these revealed regions may then be performed during downstream processing.

It is to be appreciated that the structures resulting from the above exemplary processing schemes may be used in a same or similar form for subsequent processing operations to complete device fabrication, such as CMOS, PMOS and/or NMOS device fabrication. As an example of a completed device, FIG. 5 illustrate a cross-sectional view of a non-planar integrated circuit structure as taken along a gate line, in accordance with an embodiment of the present disclosure.

Figure 5:
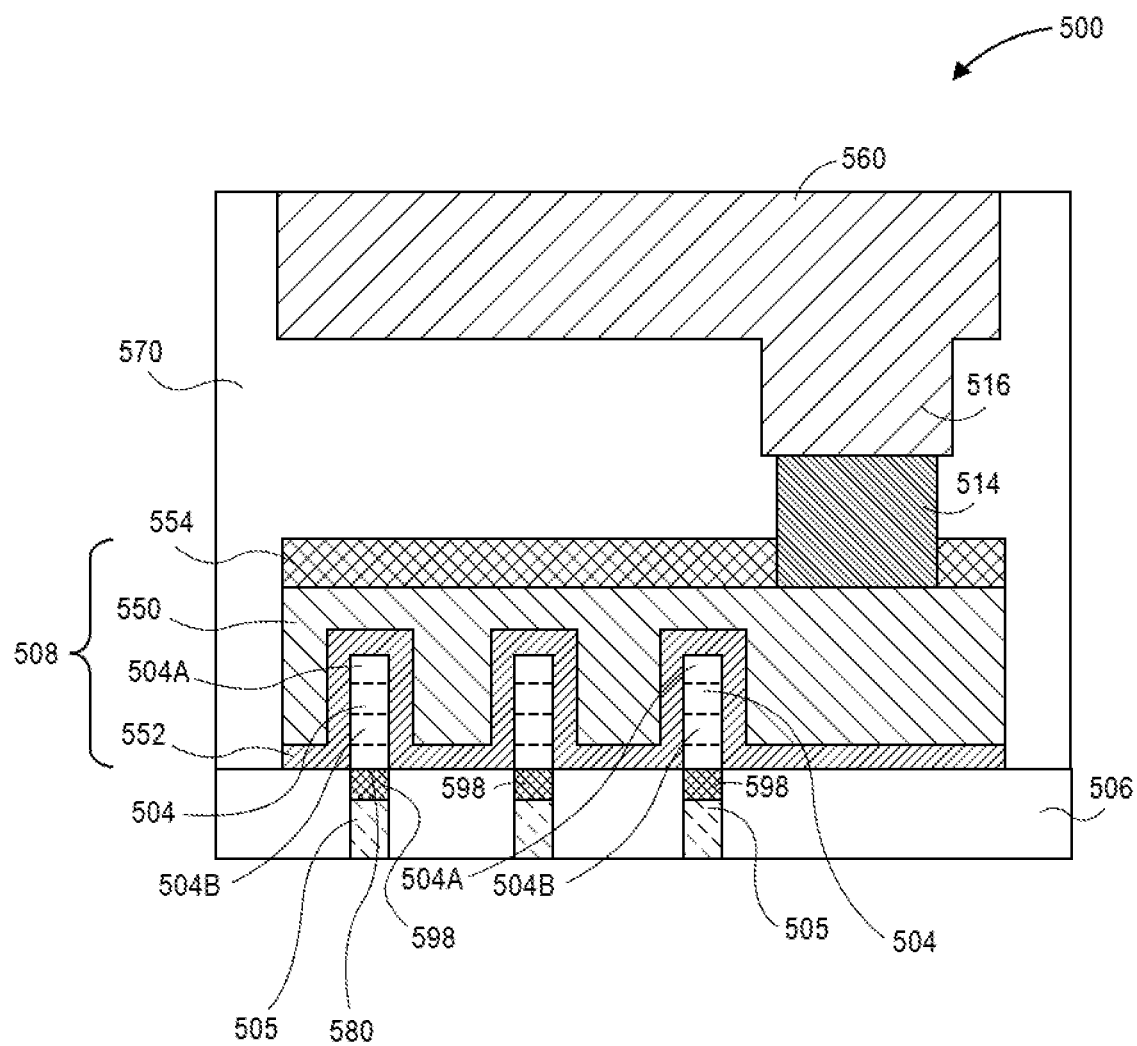
FIG. 5 illustrates a cross-sectional view of a non-planar integrated circuit structure as taken along a gate line, in accordance with an embodiment of the present disclosure.

Referring to FIG. 5, a semiconductor structure or device 500 includes a non-planar active region (e.g., a fin structure including protruding fin portion 504 and sub-fin region 505) within a trench isolation region 506. In an embodiment, instead of a solid fin, the non-planar active region is separated into nanowires (such as nanowires 504A and 504B having a cavity there between and a cavity there under) above sub-fin region 505, as is represented by the dashed lines. In either case, for ease of description for non-planar integrated circuit structure 500, a non-planar active region 504 is referenced below as a protruding fin portion. In an embodiment, a fabrication process involves use of a process scheme that provides an oxide sub-fin structure, examples of which are described above in association with FIGS. 2 and 3F. For example, in an embodiment, regions 598 are oxide sub-fin structures. In one such embodiment, sub-fin structures 598 include an oxidation catalyst layer portion thereon.

A gate line 508 is disposed over the protruding portions 504 of the non-planar active region (including, if applicable, surrounding nanowires 504A and 504B), as well as over a portion of the trench isolation region 506. As shown, gate line 508 includes a gate electrode 550 and a gate dielectric layer 552. In one embodiment, gate line 508 may also include a dielectric cap layer 554. A gate contact 514, and overlying gate contact via 516 are also seen from this perspective, along with an overlying metal interconnect 560, all of which are disposed in inter-layer dielectric stacks or layers 570. Also seen from the perspective of FIG. 5, the gate contact 514 is, in one embodiment, disposed over trench isolation region 506, but not over the non-planar active regions.

In an embodiment, the semiconductor structure or device 500 is a non-planar device such as, but not limited to, a fin-FET device, a tri-gate device, a nanoribbon device, or a nano-wire device. In such an embodiment, a corresponding semiconducting channel region is composed of or is formed in a three-dimensional body. In one such embodiment, the gate electrode stacks of gate lines 508 surround at least a top surface and a pair of sidewalls of the three-dimensional body.

As is also depicted in FIG. 5, in an embodiment, an interface 580 exists between a protruding fin portion 504 and sub-fin region 505. The interface 580 can be a transition region between a doped sub-fin region 505 and a lightly or undoped upper fin portion 504. In one such embodiment, each fin is approximately 10 nanometers wide or less, and sub-fin dopants are supplied from an adjacent solid state doping layer at the sub-fin location. In a particular such embodiment, each fin is less than 10 nanometers wide.

Although not depicted in FIG. 5, it is to be appreciated that source or drain regions of or adjacent to the protruding fin portions 504 are on either side of the gate line 508, i.e., into and out of the page. In one embodiment, the source or drain regions are doped portions of original material of the protruding fin portions 504. In another embodiment, the material of the protruding fin portions 504 is removed and replaced with another semiconductor material, e.g., by epitaxial deposition to form discrete epitaxial nubs or non-discrete epitaxial structures. In either embodiment, the source or drain regions may extend below the height of dielectric layer of trench isolation region 506, i.e., into the sub-fin region 505. In accordance with an embodiment of the present disclosure, the more heavily doped sub-fin regions, i.e., the doped portions of the fins below interface 580, inhibits source to drain leakage through this portion of the bulk semiconductor fins. In an embodiment, the source and drain structures are N-type epitaxial source and drain structures, both including phosphorous dopant impurity atoms. In accordance with one or more embodiments of the present disclosure, the source and drain regions have associated asymmetric source and drain contact structures, as described above in association with FIG. 4J.

With reference again to FIG. 5, in an embodiment, fins 504/505 (and, possibly nanowires 504A and 504B) are composed of a crystalline silicon, silicon/germanium or germanium layer doped with a charge carrier, such as but not limited to phosphorus, arsenic, boron or a combination thereof. In one embodiment, the concentration of silicon atoms is greater than 97%. In another embodiment, fins 504/505 are composed of a group III-V material, such as, but not limited to, gallium nitride, gallium phosphide, gallium arsenide, indium phosphide, indium antimonide, indium gallium arsenide, aluminum gallium arsenide, indium gallium phosphide, or a combination thereof. Trench isolation region 506 may be composed of a dielectric material such as, but not limited to, silicon dioxide, silicon oxy-nitride, silicon nitride, or carbon-doped silicon nitride.

Gate line 508 may be composed of a gate electrode stack which includes a gate dielectric layer 552 and a gate electrode layer 550. In an embodiment, the gate electrode of the gate electrode stack is composed of a metal gate and the gate dielectric layer is composed of a high-K material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the substrate fin 504. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride. In some implementations, a portion of the gate dielectric is a "U"-shaped structure that includes a bottom portion substantially parallel to the surface of the substrate and two sidewall portions that are substantially perpendicular to the top surface of the substrate.

In one embodiment, the gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer. The gate electrode layer may consist of a P-type workfunction metal or an N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a conductive fill layer. For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

Spacers associated with the gate electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

Gate contact 514 and overlying gate contact via 516 may be composed of a conductive material. In an embodiment, one or more of the contacts or vias are composed of a metal species. The metal species may be a pure metal, such as tungsten, nickel, or cobalt, or may be an alloy such as a metal-metal alloy or a metal-semiconductor alloy (e.g., such as a silicide material).

In an embodiment (although not shown), a contact pattern which is essentially perfectly aligned to an existing gate pattern 508 is formed while eliminating the use of a lithographic step with exceedingly tight registration budget. In an embodiment, the contact pattern is a vertically asymmetric contact pattern, such as described in association with FIG. 4J. In other embodiments, all contacts are front side connected and are not asymmetric. In one such embodiment, the self-aligned approach enables the use of intrinsically highly selective wet etching (e.g., versus conventionally implemented dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in conventional approaches. In an embodiment, a trench contact grid is not separately patterned, but is rather formed between poly (gate) lines. For example, in one such embodiment, a trench contact grid is formed subsequent to gate grating patterning but prior to gate grating cuts.

In an embodiment, providing structure 500 involves fabrication of the gate stack structure 508 by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

Referring again to FIG. 5, the arrangement of semiconductor structure or device 500 places the gate contact over isolation regions. Such an arrangement may be viewed as inefficient use of layout space. In another embodiment, however, a semiconductor device has contact structures that contact portions of a gate electrode formed over an active region, e.g., over a sub-fin 505, and in a same layer as a trench contact via.

It is to be appreciated that not all aspects of the processes described above need be practiced to fall within the spirit and scope of embodiments of the present disclosure. Also, the processes described herein may be used to fabricate one or a plurality of semiconductor devices. The semiconductor devices may be transistors or like devices. For example, in an embodiment, the semiconductor devices are a metal-oxide semiconductor (MOS) transistors for logic or memory, or are bipolar transistors. Also, in an embodiment, the semiconductor devices have a three-dimensional architecture, such as a nanowire device, a nanoribbon device, a gate-all-around (GAA) device, a tri-gate device, an independently accessed double gate device, or a FIN-FET. One or more embodiments may be particularly useful for fabricating semiconductor devices at a sub-10 nanometer (10 nm) technology node.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, as is also used throughout the present description, hardmask materials, capping layers, or plugs are composed of dielectric materials different from the interlayer dielectric material. In one embodiment, different hardmask, capping or plug materials may be used in different regions so as to provide different growth or etch selectivity to each other and to the underlying dielectric and metal layers. In some embodiments, a hardmask layer, capping or plug layer includes a layer of a nitride of silicon (e.g., silicon nitride) or a layer of an oxide of silicon, or both, or a combination thereof. Other suitable materials may include carbon-based materials. Other hardmask, capping or plug layers known in the arts may be used depending upon the particular implementation. The hardmask, capping or plug layers maybe formed by CVD, PVD, or by other deposition methods.

In an embodiment, as is also used throughout the present description, lithographic operations are performed using 193 nm immersion litho (i193), EUV and/or EBDW lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

In another aspect, one or more embodiments are directed to neighboring semiconductor structures or devices separated by self-aligned gate endcap (SAGE) structures. Particular embodiments may be directed to integration of multiple width (multi-Wsi) nanowires and nanoribbons in a SAGE architecture and separated by a SAGE wall. In an embodiment, nanowires/nanoribbons are integrated with multiple Wsi in a SAGE architecture portion of a front end process flow. Such a process flow may involve integration of nanowires and nanoribbons of different Wsi to provide robust functionality of next generation transistors with low power and high performance. Associated epitaxial source or drain regions may be embedded (e.g., portions of nanowires removed and then source or drain (S/D) growth is performed) or formed by vertical merging (e.g., epitaxial regions are formed around existing wires).

To provide further context, advantages of a self-aligned gate endcap (SAGE) architecture may include the enabling of higher layout density and, in particular, scaling of diffusion to diffusion spacing. To provide illustrative comparison, FIG. 6 illustrates cross-sectional views taken through nanowires and fins for a non-endcap architecture (left-hand side (a)) versus a self-aligned gate endcap (SAGE) architecture (right-hand side (b)), in accordance with an embodiment of the present disclosure.

Figure 6:
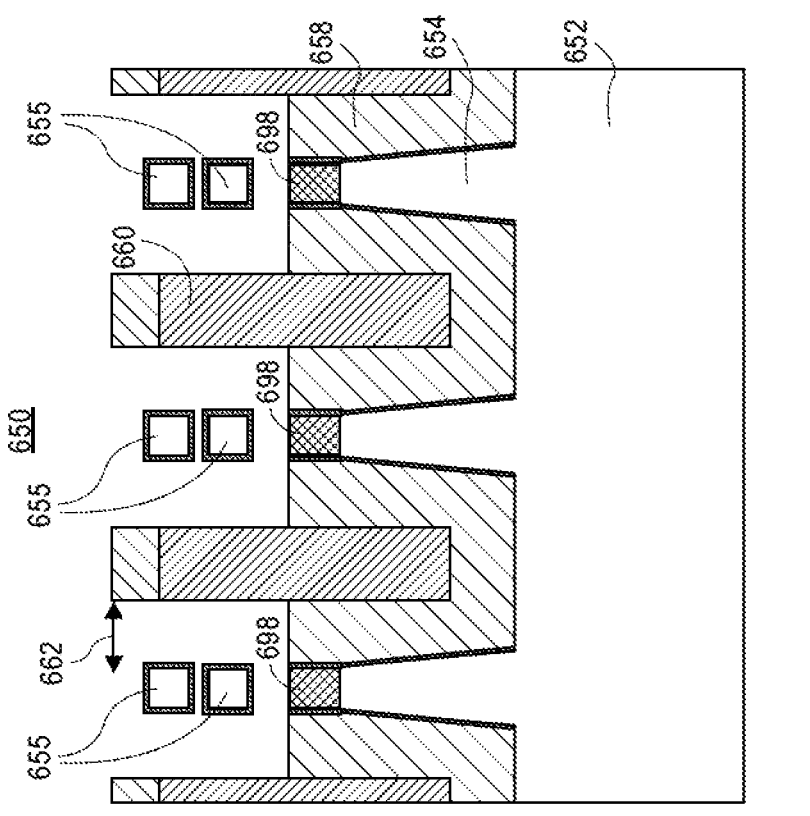
FIG. 6 illustrates cross-sectional views taken through nanowires and fins for a non-endcap architecture (left-hand side (a)) versus a self-aligned gate endcap (SAGE) architecture (right-hand side (b)), in accordance with an embodiment of the present disclosure.
Figure 6:
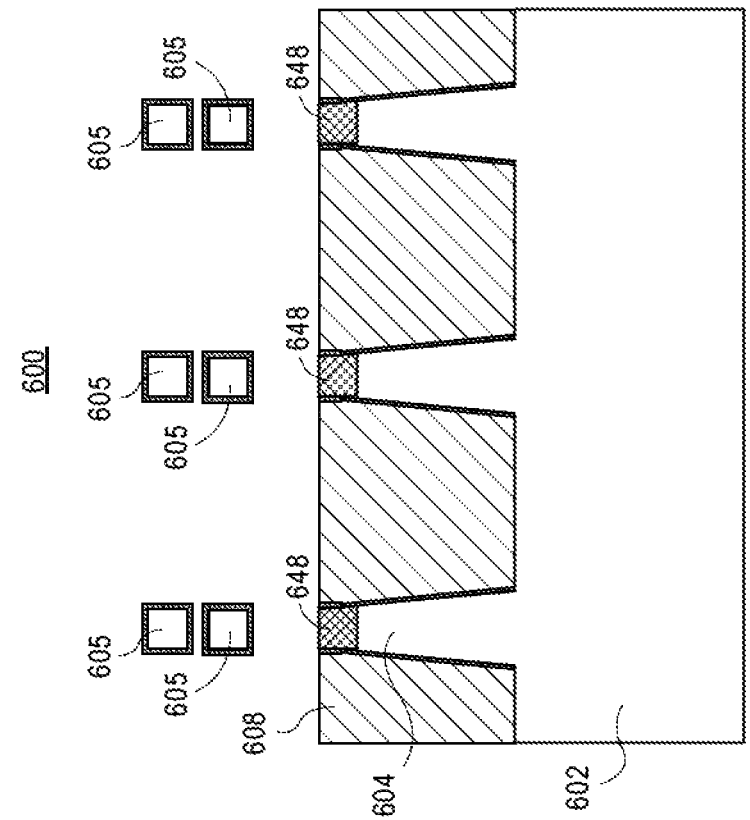

Referring to the left-hand side (a) of FIG. 6, an integrated circuit structure 600 includes a substrate 602 having sub-fins 604 protruding therefrom within an isolation structure 608 laterally surrounding the sub-fins 604. Corresponding nanowires 605 are over the sub-fins 604. In one embodiment, sub-fins 604 include an upper oxide sub-fin structure 648. In one embodiment, oxide sub-fin structure 648 includes an oxidation catalyst layer thereon. A gate structure may be formed over the integrated circuit structure 600 to fabricate a device. However, breaks in such a gate structure may be accommodated for by increasing the spacing between sub-fin 604/nanowire 605 pairings.

By contrast, referring to the right-hand side (b) of FIG. 6, an integrated circuit structure 650 includes a substrate 652 having sub-fins 654 protruding therefrom within an isolation structure 658 laterally surrounding the sub-fins 654. Corresponding nanowires 655 are over the sub-fins 654. In one embodiment, sub-fins 654 include an upper oxide sub-fin structure 698. In one embodiment, oxide sub-fin structure 698 includes an oxidation catalyst layer thereon. Isolating SAGE walls 660 are included within the isolation structure 658 and between adjacent sub-fin 654/nanowire 655 pairings. The distance between an isolating SAGE wall 660 and a nearest sub-fin 654/nanowire 655 pairings defines the gate endcap spacing 662. A gate structure may be formed over the integrated circuit structure 600, between insolating SAGE walls to fabricate a device. Breaks in such a gate structure are imposed by the isolating SAGE walls. Since the isolating SAGE walls 660 are self-aligned, restrictions from conventional approaches can be minimized to enable more aggressive diffusion to diffusion spacing. Furthermore, since gate structures include breaks at all locations, individual gate structure portions may be layer connected by local interconnects formed over the isolating SAGE walls 660. In an embodiment, as depicted, the SAGE walls 660 each include a lower dielectric portion and a dielectric cap on the lower dielectric portion, as is depicted.

In accordance with an embodiment of the present disclosure, a fabrication process for structures associated with FIG. 6 involves use of a process scheme that provides a gate-all-around integrated circuit structure having an oxide sub-fin structure, examples of which are described above in association with FIGS. 2 and 3F.

A self-aligned gate endcap (SAGE) processing scheme involves the formation of gate/trench contact endcaps self-aligned to fins without requiring an extra length to account for mask mis-registration. Thus, embodiments may be implemented to enable shrinking of transistor layout area. Embodiments described herein may involve the fabrication of gate endcap isolation structures, which may also be referred to as gate walls, isolation gate walls or self-aligned gate endcap (SAGE) walls.

Figure 7:
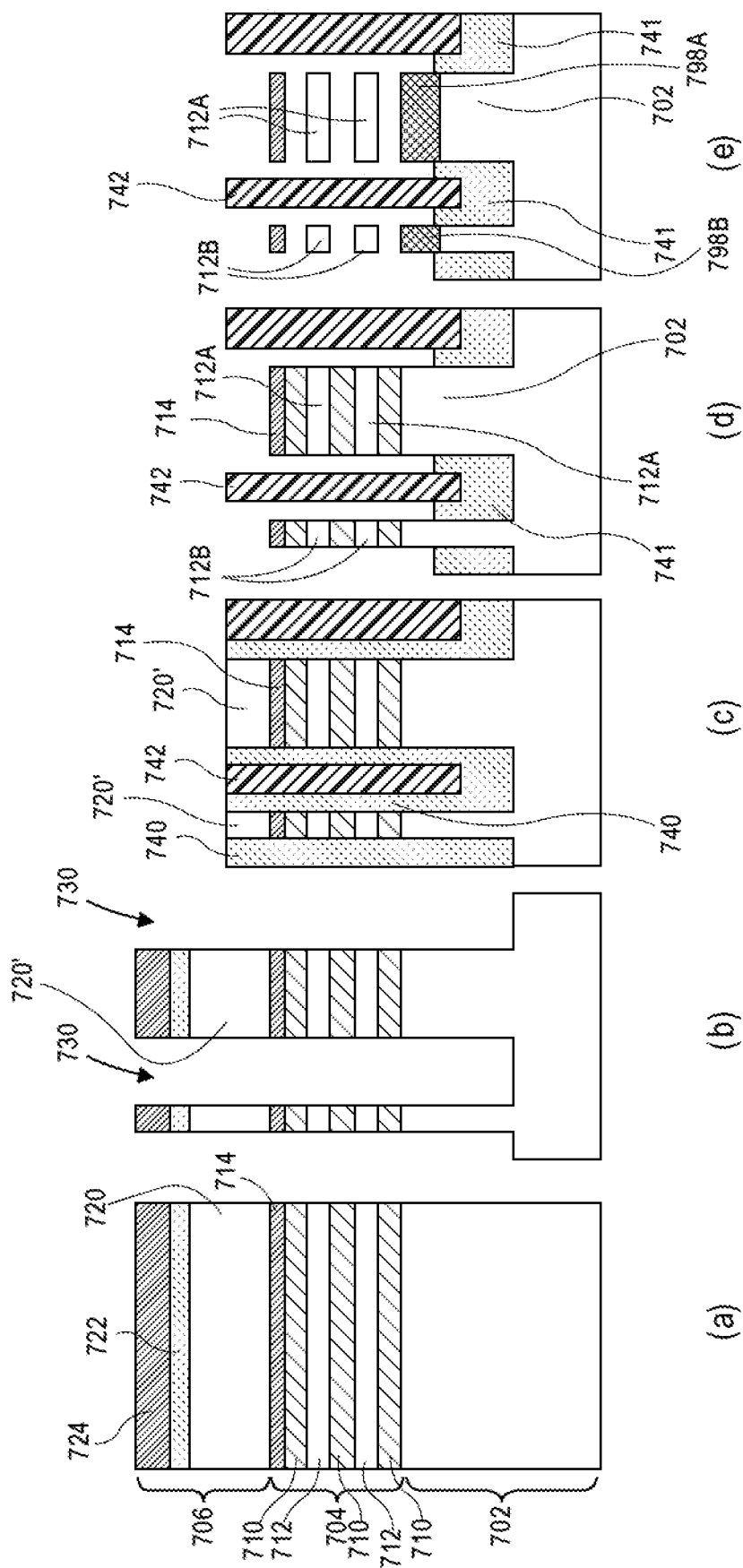
FIG. 7 illustrates cross-sectional views representing various operations in a method of fabricating a self-aligned gate endcap (SAGE) structure with gate-all-around devices, in accordance with an embodiment of the present disclosure.

In an exemplary processing scheme for structures having SAGE walls separating neighboring devices, FIG. 7 illustrate cross-sectional views representing various operations in a method of fabricating a self-aligned gate endcap (SAGE) structure with gate-all-around devices, in accordance with an embodiment of the present disclosure.

Referring to part (a) of FIG. 7, a starting structure includes a nanowire patterning stack 704 above a substrate 702. A lithographic patterning stack 706 is formed above the nanowire patterning stack 704. The nanowire patterning stack 704 includes alternating silicon germanium layers 710 and silicon layers 712. A protective mask 714 is between the nanowire patterning stack 704 and the lithographic patterning stack 706. In one embodiment, the lithographic patterning stack 706 is trilayer mask composed of a topographic masking portion 720, an anti-reflective coating (ARC) layer 722, and a photoresist layer 724. In a particular such embodiment, the topographic masking portion 720 is a carbon hardmask (CHM) layer and the anti-reflective coating layer 722 is a silicon ARC layer.

Referring to part (b) of FIG. 7, the stack of part (a) is lithographically patterned and then etched to provide an etched structure including a patterned substrate 702 and trenches 730.

Referring to part (c) of FIG. 7, the structure of part (b) has an isolation layer 740 and a SAGE material 742 formed in trenches 730. The structure is then planarized to leave patterned topographic masking layer 720' as an exposed upper layer.

Referring to part (d) of FIG. 7, the isolation layer 740 is recessed below an upper surface of the patterned substrate 702, e.g., to define a protruding fin portion and to provide a trench isolation structure 741 beneath SAGE walls 742.

Referring to part (e) of FIG. 7, the silicon germanium layers 710 are removed at least in the channel region to release silicon nanowires 712A and 712B.

In accordance with an embodiment of the present disclosure, a fabrication process for structures associated with FIG. 7 involves use of a process scheme that provides a gate-all-around integrated circuit structure having an oxide sub-fin structure, examples of which are described above in association with FIGS. 2 and 3F. For example, referring to part (e) of FIG. 7, in an embodiment, nanowires 712B and nanoribbons 712A are above an oxide sub-fin structure 798B or 798A, respectively. In one such embodiment, oxide sub-fin structures 798B and/or 798A include an oxidation catalyst layer thereon.

Subsequent to the formation of the structure of part (e) of FIG. 7, one or more gate stacks may be formed around the nanowires and/or nanoribbons, over oxide sub-fin structures 798A and 798B, and between SAGE walls 742. In one embodiment, prior to formation of the gate stacks, the remaining portion of protective mask 714 is removed. In another embodiment, the remaining portion of protective mask 714 is retained as an insulating fin hat as an artifact of the processing scheme.

Referring again to part (e) of FIG. 7, it is to be appreciated that a channel view is depicted, with source or drain regions being locating into and out of the page. In an embodiment, the channel region including nanowires 712B has a width less than the channel region including nanowires 712A. Thus, in an embodiment, an integrated circuit structure includes multiple width (multi-Wsi) nanowires. Although structures of 712B and 712A may be differentiated as nanowires and nanoribbons, respectively, both such structures are typically referred to herein as nanowires. It is also to be appreciated that reference to or depiction of a fin/nanowire pair throughout may refer to a structure including a fin and one or more overlying nanowires (e.g., two overlying nanowires are shown in FIG. 7).

To highlight an exemplary integrated circuit structure having three vertically arranged nanowires, FIG. 8A illustrates a three-dimensional cross-sectional view of a nanowire-based integrated circuit structure, in accordance with an embodiment of the present disclosure. FIG. 8B illustrates a cross-sectional source or drain view of the nanowire-based integrated circuit structure of FIG. 8A, as taken along the a-a' axis. FIG. 8C illustrates a cross-sectional channel view of the nanowire-based integrated circuit structure of FIG. 8A, as taken along the b-b' axis.

Referring to FIG. 8A, an integrated circuit structure 800 includes one or more vertically stacked nanowires (804 set) above a substrate 802. An optional fin between the bottommost nanowire and the substrate 802 is not depicted for the sake of emphasizing the nanowire portion for illustrative purposes. Embodiments herein are targeted at both single wire devices and multiple wire devices. As an example, a three nanowire-based devices having nanowires 804A, 804B and 804C is shown for illustrative purposes. For convenience of description, nanowire 804A is used as an example where description is focused on one of the nanowires. It is to be appreciated that where attributes of one nanowire are described, embodiments based on a plurality of nanowires may have the same or essentially the same attributes for each of the nanowires.

Each of the nanowires 804 includes a channel region 806 in the nanowire. The channel region 806 has a length (L). Referring to FIG. 8C, the channel region also has a perimeter (Pc) orthogonal to the length (L). Referring to both FIGS. 8A and 8C, a gate electrode stack 808 surrounds the entire perimeter (Pc) of each of the channel regions 806. The gate electrode stack 808 includes a gate electrode along with a gate dielectric layer between the channel region 806 and the gate electrode (not shown). In an embodiment, the channel region is discrete in that it is completely surrounded by the gate electrode stack 808 without any intervening material such as underlying substrate material or overlying channel fabrication materials. Accordingly, in embodiments having a plurality of nanowires 804, the channel regions 806 of the nanowires are also discrete relative to one another.

In accordance with an embodiment of the present disclosure, a fabrication process for structures associated with FIGS. 8A-8C involves use of a process scheme that provides a gate-all-around integrated circuit structure having an oxide sub-fin structure, examples of which are described above in association with FIGS. 2 and 3F. For example, in one embodiment, the upper portion of substrate 802 depicted in FIGS. 8A-8C is an oxide sub-fin structure.

Referring to both FIGS. 8A and 8B, integrated circuit structure 800 includes a pair of non-discrete source or drain regions 810/812. The pair of non-discrete source or drain regions 810/812 is on either side of the channel regions 806 of the plurality of vertically stacked nanowires 804. Furthermore, the pair of non-discrete source or drain regions 810/812 is adjoining for the channel regions 806 of the plurality of vertically stacked nanowires 804. In one such embodiment, not depicted, the pair of non-discrete source or drain regions 810/812 is directly vertically adjoining for the channel regions 806 in that epitaxial growth is on and between nanowire portions extending beyond the channel regions 806, where nanowire ends are shown within the source or drain structures. In another embodiment, as depicted in FIG. 8A, the pair of non-discrete source or drain regions 810/812 is indirectly vertically adjoining for the channel regions 806 in that they are formed at the ends of the nanowires and not between the nanowires.

In an embodiment, as depicted, the source or drain regions 810/812 are non-discrete in that there are not individual and discrete source or drain regions for each channel region 806 of a nanowire 804. Accordingly, in embodiments having a plurality of nanowires 804, the source or drain regions 810/812 of the nanowires are global or unified source or drain regions as opposed to discrete for each nanowire. In one embodiment, from a cross-sectional perspective orthogonal to the length of the discrete channel regions 806, each of the pair of non-discrete source or drain regions 810/812 is approximately rectangular in shape with a bottom tapered portion and a top vertex portion, as depicted in FIG. 8B. In other embodiments, however, the source or drain regions 810/812 of the nanowires are relatively larger yet discrete non-vertically merged epitaxial structures such as nubs described in association with FIGS. 4F-4J.

In accordance with an embodiment of the present disclosure, and as depicted in FIGS. 8A and 8B, integrated circuit structure 800 further includes a pair of contacts 814, each contact 814 on one of the pair of non-discrete source or drain regions 810/812. In one such embodiment, in a vertical sense, each contact 814 completely surrounds the respective non-discrete source or drain region 810/812. In another aspect, the entire perimeter of the non-discrete source or drain regions 810/812 may not be accessible for contact with contacts 814, and the contact 814 thus only partially surrounds the non-discrete source or drain regions 810/812, as depicted in FIG. 8B. In a contrasting embodiment, not depicted, the entire perimeter of the non-discrete source or drain regions 810/812, as taken along the a-a' axis, is surrounded by the contacts 814. In accordance with an embodiment of the present disclosure, although not depicted, the pair of contacts 814 is an asymmetric pair of contacts, as described in association with FIG. 4J.

Referring to FIGS. 8B and 8C, the non-discrete source or drain regions 810/812 are global in the sense that a single unified feature is used as a source or drain region for a plurality (in this case, 3) of nanowires 804 and, more particularly, for more than one discrete channel region 806. In an embodiment, the pair of non-discrete source or drain regions 810/812 is composed of a semiconductor material different than the semiconductor material of the discrete channel regions 806, e.g., the pair of non-discrete source or drain regions 810/812 is composed of a silicon germanium while the discrete channel regions 806 are composed of silicon. In another embodiment, the pair of non-discrete source or drain regions 810/812 is composed of a semiconductor material the same or essentially the same as the semiconductor material of the discrete channel regions 806, e.g., both the pair of non-discrete source or drain regions 810/812 and the discrete channel regions 806 are composed of silicon.

Referring again to FIG. 8A, in an embodiment, integrated circuit structure 800 further includes a pair of spacers 816. As is depicted, outer portions of the pair of spacers 816 may overlap portions of the non-discrete source or drain regions 810/812, providing for "embedded" portions of the non-discrete source or drain regions 810/812 beneath the pair of spacers 816. As is also depicted, the embedded portions of the non-discrete source or drain regions 810/812 may not extend beneath the entirety of the pair of spacers 816.

Substrate 802 may be composed of a material suitable for integrated circuit structure fabrication. In one embodiment, substrate 802 includes a lower bulk substrate composed of a single crystal of a material which may include, but is not limited to, silicon, germanium, silicon-germanium or a III-V compound semiconductor material. An upper insulator layer composed of a material which may include, but is not limited to, silicon dioxide, silicon nitride or silicon oxynitride is on the lower bulk substrate. Thus, the structure 800 may be fabricated from a starting semiconductor-on-insulator substrate. Alternatively, the structure 800 is formed directly from a bulk substrate and local oxidation is used to form electrically insulative portions in place of the above described upper insulator layer. In another alternative embodiment, the structure 800 is formed directly from a bulk substrate and doping is used to form electrically isolated active regions, such as nanowires, thereon. In one such embodiment, the first nanowire (i.e., proximate the substrate) is in the form of an omega-FET type structure.

In an embodiment, the nanowires 804 may be sized as wires or ribbons, as described below, and may have squared-off or rounder corners. In an embodiment, the nanowires 804 are composed of a material such as, but not limited to, silicon, germanium, or a combination thereof. In one such embodiment, the nanowires are single-crystalline. For example, for a silicon nanowire 804, a single-crystalline nanowire may be based from a (100) global orientation, e.g., with a <100> plane in the z-direction. As described below, other orientations may also be considered. In an embodiment, the dimensions of the nanowires 804, from a cross-sectional perspective, are on the nano-scale. For example, in a specific embodiment, the smallest dimension of the nanowires 804 is less than approximately 20 nanometers. In an embodiment, the nanowires 804 are composed of a strained material, particularly in the channel regions 806.

Referring to FIG. 8C, in an embodiment, each of the channel regions 806 has a width (Wc) and a height (Hc), the width (Wc) approximately the same as the height (Hc). That is, in both cases, the channel regions 806 are square-like or, if corner-rounded, circle-like in cross-section profile. In another aspect, the width and height of the channel region need not be the same, such as the case for nanoribbbons as described throughout.

In an embodiment, as described throughout, an integrated circuit structure includes non-planar devices such as, but not limited to, a finFET or a tri-gate device with corresponding one or more overlying nanowire structures. In such an embodiment, a corresponding semiconducting channel region is composed of or is formed in a three-dimensional body with one or more discrete nanowire channel portions overlying the three-dimensional body. In one such embodiment, the gate structures surround at least a top surface and a pair of sidewalls of the three-dimensional body, and further surrounds each of the one or more discrete nanowire channel portions.

In an embodiment, as described throughout, a substrate may be composed of a semiconductor material that can withstand a manufacturing process and in which charge can migrate. In an embodiment, the substrate is a bulk substrate composed of a crystalline silicon, silicon/germanium or germanium layer doped with a charge carrier, such as but not limited to phosphorus, arsenic, boron or a combination thereof, to form an active region. In one embodiment, the concentration of silicon atoms in a bulk substrate is greater than 97%. In another embodiment, a bulk substrate is composed of an epitaxial layer grown atop a distinct crystalline substrate, e.g. a silicon epitaxial layer grown atop a boron-doped bulk silicon mono-crystalline substrate. A bulk substrate may alternatively be composed of a group III-V material. In an embodiment, a bulk substrate is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, a bulk substrate is composed of a III-V material and the charge-carrier dopant impurity atoms are ones such as, but not limited to, carbon, silicon, germanium, oxygen, sulfur, selenium or tellurium.

In an embodiment, as described throughout, a trench isolation layer may be composed of a material suitable to ultimately electrically isolate, or contribute to the isolation of, portions of a permanent gate structure from an underlying bulk substrate or isolate active regions formed within an underlying bulk substrate, such as isolating fin active regions. For example, in one embodiment, a trench isolation layer is composed of a dielectric material such as, but not limited to, silicon dioxide, silicon oxy-nitride, silicon nitride, or carbon-doped silicon nitride.

In an embodiment, as described throughout, self-aligned gate endcap isolation structures may be composed of a material or materials suitable to ultimately electrically isolate, or contribute to the isolation of, portions of permanent gate structures from one another. Exemplary materials or material combinations include a single material structure such as silicon dioxide, silicon oxy-nitride, silicon nitride, or carbon-doped silicon nitride. Other exemplary materials or material combinations include a multi-layer stack having lower portion silicon dioxide, silicon oxy-nitride, silicon nitride, or carbon-doped silicon nitride and an upper portion higher dielectric constant material such as hafnium oxide.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 9:
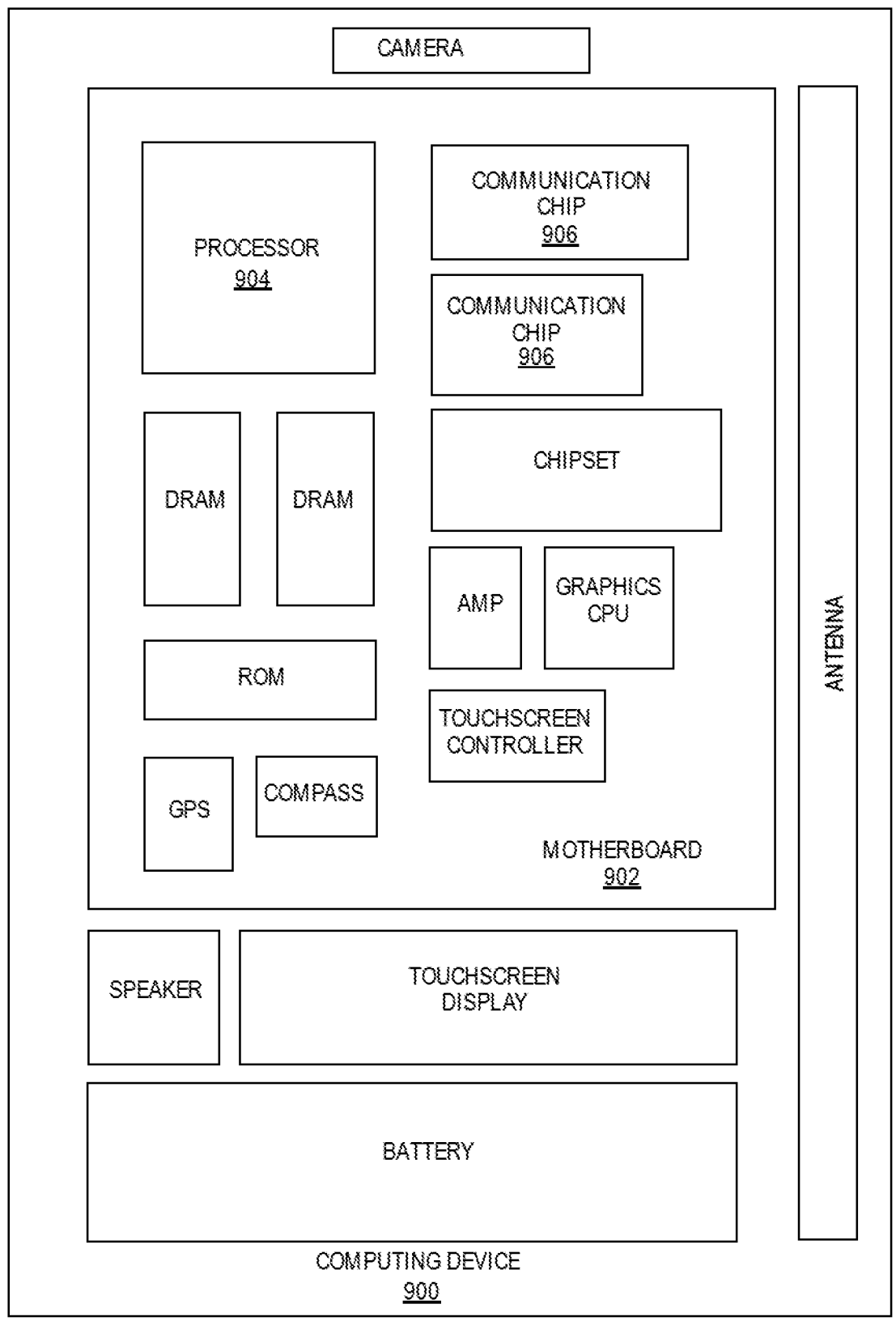
FIG. 9 illustrates a computing device in accordance with one implementation of an embodiment of the disclosure.

FIG. 9 illustrates a computing device 900 in accordance with one implementation of an embodiment of the present disclosure. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

Depending on its applications, computing device 900 may include other components that may or may not be physically and electrically coupled to the board 902. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. The integrated circuit die of the processor 904 may include one or more structures, such as gate-all-around integrated circuit structures having oxide sub-fin structures built in accordance with implementations of embodiments of the present disclosure. The term "processor" may refer to any device or portion of a device that processes electronic data from registers and/or memory to transform that electronic data into other electronic data that may be stored in registers and/or memory.

The communication chip 906 also includes an integrated circuit die packaged within the communication chip 906. The integrated circuit die of the communication chip 906 may include one or more structures, such as gate-all-around integrated circuit structures having oxide sub-fin structures built in accordance with implementations of embodiments of the present disclosure.

In further implementations, another component housed within the computing device 900 may contain an integrated circuit die that includes one or structures, such as gate-all-around integrated circuit structures having oxide sub-fin structures built in accordance with implementations of embodiments of the present disclosure.

In various implementations, the computing device 900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

Figure 10:
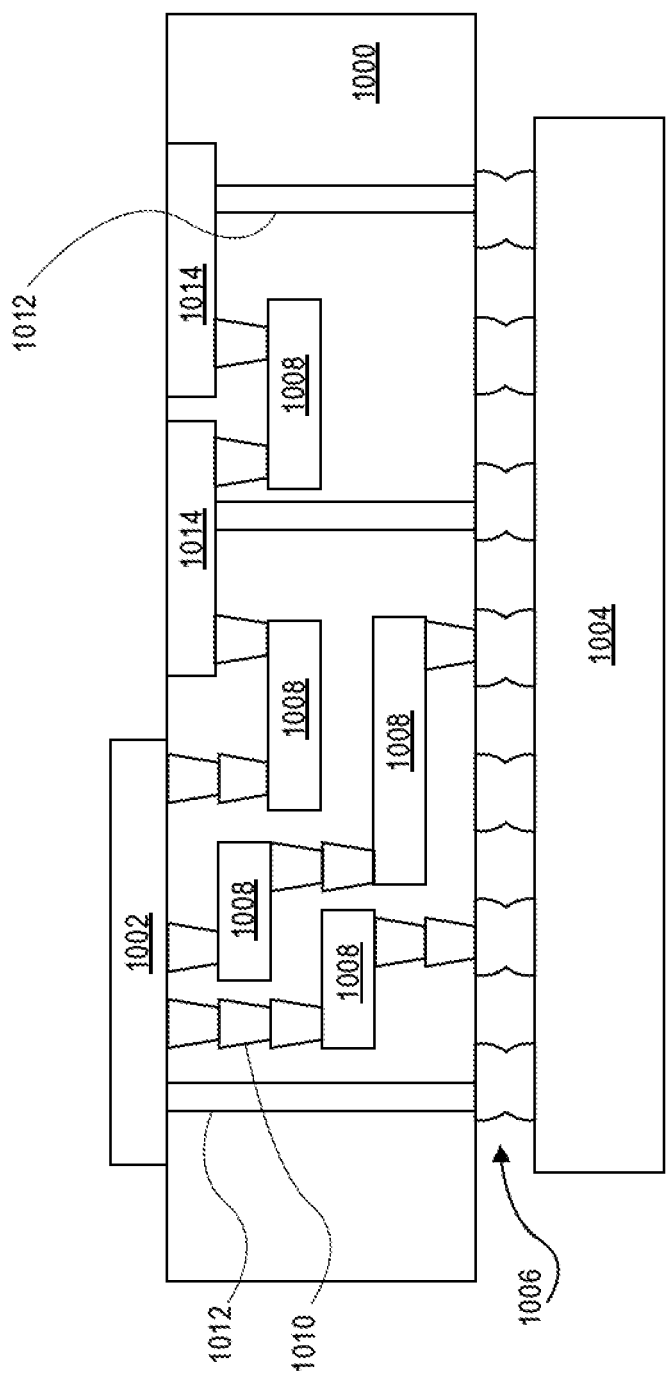
FIG. 10 illustrates an interposer that includes one or more embodiments of the disclosure.

FIG. 10 illustrates an interposer 1000 that includes one or more embodiments of the present disclosure. The interposer 1000 is an intervening substrate used to bridge a first substrate 1002 to a second substrate 1004. The first substrate 1002 may be, for instance, an integrated circuit die. The second substrate 1004 may be, for instance, a memory module, a computer motherboard, or another integrated circuit die. Generally, the purpose of an interposer 1000 is to spread a connection to a wider pitch or to reroute a connection to a different connection. For example, an interposer 1000 may couple an integrated circuit die to a ball grid array (BGA) 1006 that can subsequently be coupled to the second substrate 1004. In some embodiments, the first and second substrates 1002/1004 are attached to opposing sides of the interposer 1000. In other embodiments, the first and second substrates 1002/1004 are attached to the same side of the interposer 1000. And in further embodiments, three or more substrates are interconnected by way of the interposer 1000.

The interposer 1000 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1008 and vias 1010, including but not limited to through-silicon vias (TSVs) 1012. The interposer 1000 may further include embedded devices 1014, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1000. In accordance with embodiments of the disclosure, apparatuses or processes disclosed herein may be used in the fabrication of interposer 1000 or in the fabrication of components included in the interposer 1000.

Thus, embodiments of the present disclosure include gate-all-around integrated circuit structures having oxide sub-fins, and methods of fabricating gate-all-around integrated circuit structures having oxide sub-fins.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example Embodiment 1

An integrated circuit structure includes an oxide sub-fin structure having a top and sidewalls. An oxidation catalyst layer is on the top and sidewalls of the oxide sub-fin structure. A vertical arrangement of nanowires is above the oxide sub-fin structure. A gate stack is surrounding the vertical arrangement of nanowires and on at least the portion of the oxidation catalyst layer on the top of the oxide sub-fin structure.

Example Embodiment 2

The integrated circuit structure of example embodiment 1, wherein the oxidation catalyst layer includes aluminum oxide.

Example Embodiment 3

The integrated circuit structure of example embodiment 1 or 2, wherein the oxidation catalyst layer includes lanthanum oxide.

Example Embodiment 4

The integrated circuit structure of example embodiment 1, 2 or 3, further including epitaxial source or drain structures at ends of the vertical arrangement of nanowires.

Example Embodiment 5

The integrated circuit structure of example embodiment 4, wherein the epitaxial source or drain structures are discrete epitaxial source or drain structures.

Example Embodiment 6

The integrated circuit structure of example embodiment 4, wherein the epitaxial source or drain structures are non-discrete epitaxial source or drain structures.

Example Embodiment 7

The integrated circuit structure of example embodiment 4, 5 or 6, wherein the gate stack has dielectric sidewall spacers, and the epitaxial source or drain structures are embedded epitaxial source or drain structures extending beneath the dielectric sidewall spacers of the gate stack.

Example Embodiment 8

The integrated circuit structure of example embodiment 4, 5, 6 or 7, further including a pair of conductive contact structures coupled to the epitaxial source or drain structures.

Example Embodiment 9

The integrated circuit structure of example embodiment 8, wherein the pair of conductive contact structures is an asymmetric pair of conductive contact structures.

Example Embodiment 10

The integrated circuit structure of example embodiment 1, 2, 3, 4, 5, 6, 7, 8 or 9, wherein the gate stack includes a high-k gate dielectric layer and a metal gate electrode.

Example Embodiment 11

An integrated circuit structure includes an oxide sub-fin structure having a top and sidewalls. An oxidation catalyst layer is on the sidewalls but not on the top of the oxide sub-fin structure. A vertical arrangement of nanowires is above the oxide sub-fin structure. A gate stack is surrounding the vertical arrangement of nanowires and on the top of the oxide sub-fin structure.

Example Embodiment 12

The integrated circuit structure of example embodiment 11, wherein the oxidation catalyst layer includes aluminum oxide.

Example Embodiment 13

The integrated circuit structure of example embodiment 11 or 12, wherein the oxidation catalyst layer includes lanthanum oxide.

Example Embodiment 14

The integrated circuit structure of example embodiment 11, 12 or 13, further including epitaxial source or drain structures at ends of the vertical arrangement of nanowires.

Example Embodiment 15

The integrated circuit structure of example embodiment 14, wherein the epitaxial source or drain structures are discrete epitaxial source or drain structures.

Example Embodiment 16

The integrated circuit structure of example embodiment 14, wherein the epitaxial source or drain structures are non-discrete epitaxial source or drain structures.

Example Embodiment 17

The integrated circuit structure of example embodiment 14, 15 or 16, wherein the gate stack has dielectric sidewall spacers, and the epitaxial source or drain structures are embedded epitaxial source or drain structures extending beneath the dielectric sidewall spacers of the gate stack.

Example Embodiment 18

The integrated circuit structure of example embodiment 14, 15, 16 or 17, further including a pair of conductive contact structures coupled to the epitaxial source or drain structures.

Example Embodiment 19

The integrated circuit structure of example embodiment 8, wherein the pair of conductive contact structures is an asymmetric pair of conductive contact structures.

Example Embodiment 20

The integrated circuit structure of example embodiment 11, 12, 13, 14, 15, 16, 17, 18 or 19, wherein the gate stack includes a high-k gate dielectric layer and a metal gate electrode.

Example Embodiment 21

A method of fabricating an integrated circuit structure includes forming a vertical arrangement of nanowires above a semiconductor sub-fin structure, oxidizing the sub-fin structure using an oxidation catalyst layer to form an oxide sub-fin structure, and forming a gate stack around the vertical arrangement of nanowires and over the oxide sub-fin structure.

Example Embodiment 22

The method of embodiment 21, wherein the oxidation catalyst layer is formed subsequent to removing a sacrificial release material interleaved with the vertical arrangement of nanowires.

Example Embodiment 23

The method of embodiment 21, wherein the oxidation catalyst layer is formed prior to removing a sacrificial release material interleaved with the vertical arrangement of nanowires.

What is claimed is:
1. An integrated circuit structure, comprising:
an oxide sub-fin structure having a top and sidewalls;
an oxidation catalyst layer on the top and sidewalls of the oxide sub-fin structure;
a vertical arrangement of nanowires vertically overlapping with the oxide sub-fin structure;
a gate stack surrounding the vertical arrangement of nanowires and on at least the portion of the oxidation catalyst layer on the top of the oxide sub-fin structure.
2. The integrated circuit structure of claim 1, wherein the oxidation catalyst layer comprises aluminum oxide.
3. The integrated circuit structure of claim 1, wherein the oxidation catalyst layer comprises lanthanum oxide.
4. The integrated circuit structure of claim 1, further comprising:
epitaxial source or drain structures at ends of the vertical arrangement of nanowires.
5. The integrated circuit structure of claim 4, wherein the epitaxial source or drain structures are discrete epitaxial source or drain structures.
6. The integrated circuit structure of claim 4, wherein the epitaxial source or drain structures are non-discrete epitaxial source or drain structures.

7. The integrated circuit structure of claim 4, wherein the gate stack has dielectric sidewall spacers, and the epitaxial source or drain structures are embedded epitaxial source or drain structures extending beneath the dielectric sidewall spacers of the gate stack.

8. The integrated circuit structure of claim 4, further comprising:
   a pair of conductive contact structures coupled to the epitaxial source or drain structures.

9. The integrated circuit structure of claim 8, wherein the pair of conductive contact structures is an asymmetric pair of conductive contact structures.

10. The integrated circuit structure of claim 1, wherein the gate stack comprises a high-k gate dielectric layer and a metal gate electrode.

* * * * *